(12) United States Patent  
Kobayashi et al.

(10) Patent No.: US 10,121,797 B2  
(45) Date of Patent: Nov. 6, 2018

(54) SEMICONDUCTOR MEMORY DEVICE

(71) Applicant: TOSHIBA MEMORY CORPORATION, Minato-ku (JP)

(72) Inventors: Shigeki Kobayashi, Kuwana (JP); Satoshi Konagai, Kasugai (JP); Atsushi Konno, Yokkaichi (JP); Kenta Yamada, Yokkaichi (JP); Masaaki Higuchi, Yokkaichi (JP); Masao Shingu, Yokkaichi (JP); Soichiro Kitazaki, Yokohama (JP); Yoshimasa Mikajiri, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 1 day.

(21) Appl. No.: 15/269,082

(22) Filed: Sep. 19, 2016

(65) Prior Publication Data

US 2017/0243873 A1 Aug. 24, 2017

Related U.S. Application Data

(60) Provisional application No. 62/297,976, filed on Feb. 22, 2016.

(51) Int. Cl.  
*H01L 27/115* (2017.01)  
*H01L 29/51* (2006.01)  
(Continued)

(52) U.S. Cl.  
CPC .. *H01L 27/11582* (2013.01); *H01L 21/28088* (2013.01); *H01L 21/28114* (2013.01);  
(Continued)

(58) Field of Classification Search  
CPC .......... H01L 27/1152; H01L 27/11529; H01L 27/11582; H01L 29/7926; H01L 27/11556;  
(Continued)

(56) References Cited

U.S. PATENT DOCUMENTS 6,255,731 B1 7/2001 Ohmi et al.  
6,861,712 B2 3/2005 Gao et al.  
(Continued)

FOREIGN PATENT DOCUMENTS

JP 11-103035 4/1999  
JP 2005-244186 9/2005  
JP 2009-119803 6/2009

*Primary Examiner* — Jonathan Han  
(74) *Attorney, Agent, or Firm* — Oblon, McClelland, Maier & Neustadt, L.L.P.

(57) ABSTRACT

According to an embodiment, a semiconductor memory device comprises: a stacked body including control gate electrodes stacked upwardly of a substrate; a semiconductor layer facing the control gate electrodes; and a gate insulating layer provided between the control gate electrode and the semiconductor layer. The stacked body comprises: a first metal layer configuring the control gate electrode; a first barrier metal layer contacting an upper surface of this first metal layer; a first silicon nitride layer contacting an upper surface of this first barrier metal layer; a first inter-layer insulating layer contacting an upper surface of this first silicon nitride layer; a second barrier metal layer contacting a lower surface of the first metal layer; a second silicon nitride layer contacting a lower surface of this second barrier metal layer; and a second inter-layer insulating layer contacting a lower surface of this second silicon nitride layer.

11 Claims, 26 Drawing Sheets

(51) Int. Cl.
*H01L 27/11582* (2017.01)
*H01L 29/423* (2006.01)
*H01L 29/49* (2006.01)
*H01L 21/285* (2006.01)
*H01L 21/28* (2006.01)
*H01L 21/768* (2006.01)

(52) U.S. Cl.
CPC .. *H01L 21/28158* (2013.01); *H01L 21/28556* (2013.01); *H01L 21/76831* (2013.01); *H01L 29/42364* (2013.01); *H01L 29/42376* (2013.01); *H01L 29/4966* (2013.01); *H01L 29/518* (2013.01); *H01L 29/4234* (2013.01); *H01L 29/42324* (2013.01)

(58) Field of Classification Search
CPC ........... H01L 27/1157; H01L 29/66833; G11C 16/0483
USPC ......... 257/324, 314, 316, E29.309; 438/287, 438/268
See application file for complete search history.

(56) References Cited

U.S. PATENT DOCUMENTS

| | | |
|---|---|---|
| 7,859,066 B2 | 12/2010 | Kito et al. |
| 7,934,530 B2 | 5/2011 | Uozumi et al. |
| 8,368,175 B2 | 2/2013 | Nakagawa et al. |
| 8,476,713 B2 | 7/2013 | Lee et al. |
| 8,766,351 B2 | 7/2014 | Imamura et al. |
| 2010/0207185 A1* | 8/2010 | Lee .................. H01L 21/28282 257/314 |
| 2011/0233648 A1* | 9/2011 | Seol ................. H01L 21/32137 257/324 |
| 2011/0298038 A1* | 12/2011 | Son ................... H01L 27/11578 257/324 |
| 2012/0077320 A1* | 3/2012 | Shim ................. H01L 27/11582 438/269 |
| 2012/0175695 A1 | 7/2012 | Sato et al. |
| 2013/0200450 A1* | 8/2013 | Kusai ................ H01L 29/66833 257/324 |
| 2014/0054675 A1* | 2/2014 | Lee .................... H01L 29/7926 257/324 |
| 2015/0364485 A1* | 12/2015 | Shimura ........... H01L 27/11556 257/316 |

* cited by examiner

SEMICONDUCTOR MEMORY DEVICE

CROSS-REFERENCE TO RELATED APPLICATIONS

This application is based upon and claims the benefit of U.S. Provisional Patent Application No. 62/297,976, filed on Feb. 22, 2016, the entire contents of which are incorporated herein by reference.

BACKGROUND

Field

Embodiments described herein relate to a semiconductor memory device.

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

DETAILED DESCRIPTION

Figure 1:
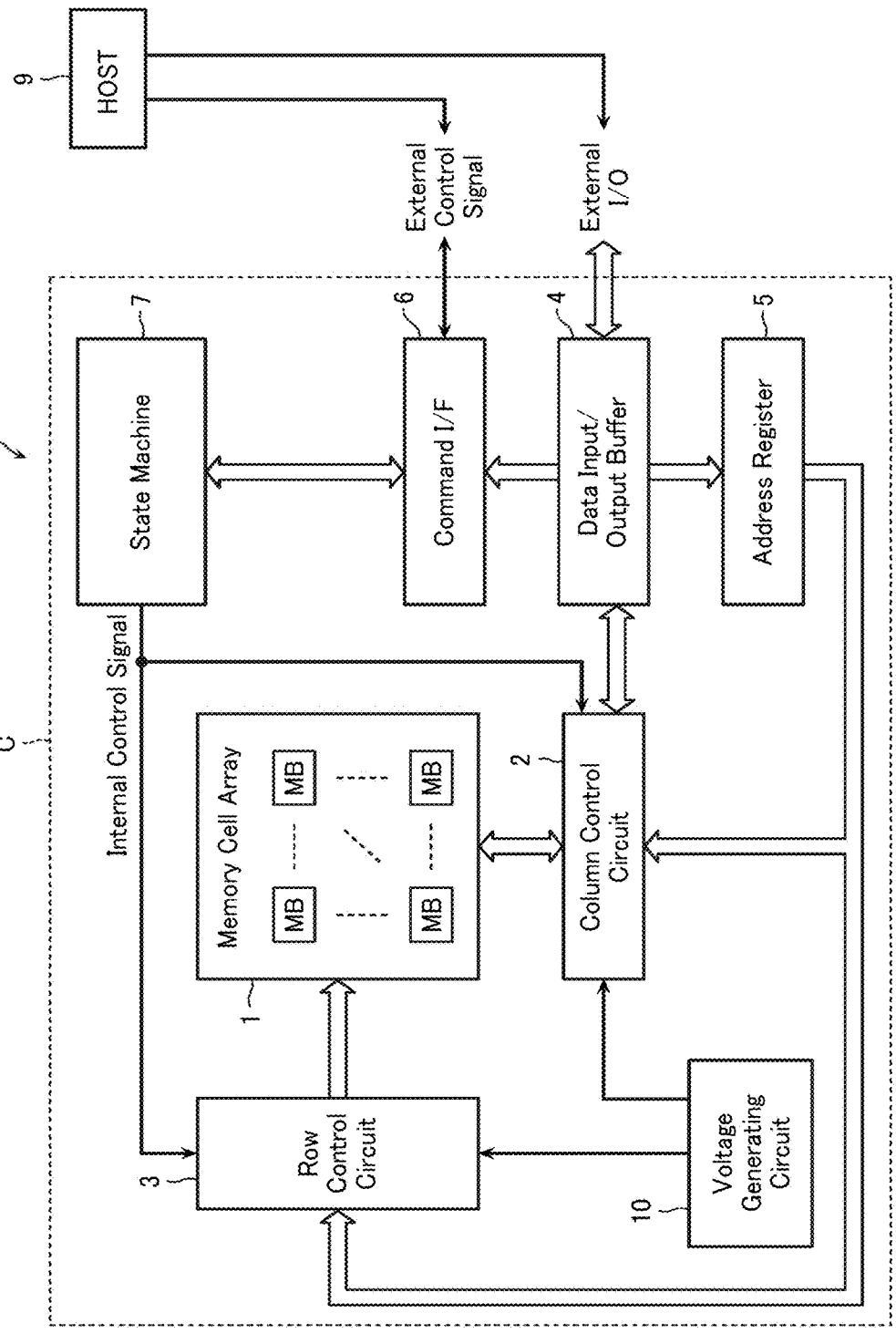
FIG. 1 is a block diagram of a nonvolatile semiconductor memory device according to a first embodiment.

A semiconductor memory device according to an embodiment comprises: a stacked body including a plurality of control gate electrodes stacked upwardly of a substrate; a semiconductor layer extending along a first direction intersecting an upper surface of the substrate, the semiconductor layer facing the plurality of control gate electrodes; and a gate insulating layer provided between the control gate electrode and the semiconductor layer. Moreover, the stacked body comprises: a first metal layer configuring the control gate electrode; a first barrier metal layer contacting an upper surface of this first metal layer; a first silicon nitride layer contacting an upper surface of this first barrier metal layer; and a first inter-layer insulating layer contacting an upper surface of this first silicon nitride layer. In addition, the stacked body comprises: a second barrier metal layer contacting a lower surface of the first metal layer; a second silicon nitride layer contacting a lower surface of this second barrier metal layer; and a second inter-layer insulating layer contacting a lower surface of this second silicon nitride layer.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below comprise a plurality of memory cells (memory transistors) arranged in a first direction intersecting an upper surface of a substrate. These memory cells include: a semiconductor layer extending in the first direction and functioning as a channel body; and a control gate electrode provided on a side surface of the semiconductor layer via a gate insulating layer.

These plurality of memory cells configure a memory string. One memory string may include one semiconductor layer, or may include two or more semiconductor layers joined at one ends (lower ends) thereof.

In addition, the above-described memory cell may be a MONOS (Metal-Oxide-Nitride-Oxide-Semiconductor) type memory cell that includes a charge accumulation layer configured from a nitride and a control gate electrode made of a metal, or may be a SONOS (Semiconductor-Oxide-Nitride-Oxide-Semiconductor) type memory cell that includes a control gate electrode made of a semiconductor.

Moreover, the above-described gate insulating layer may include a floating gate, not a charge accumulation layer configured from a nitride.

With regard to an example of the memory cell having a floating gate, reference is made to the U.S. patent application Ser. No. 13/112,345 whose disclosure content is herewith incorporated by this reference.

Moreover, each of the drawings of the nonvolatile semiconductor memory devices employed in the embodiments below is schematic, and thicknesses, widths, ratios, and so on, of layers are different from those of the actual nonvolatile semiconductor memory devices.

First Embodiment

[Configuration of Semiconductor Memory Device]

FIG. 1 is a block diagram of a nonvolatile semiconductor memory device according to a first embodiment. Note that the nonvolatile semiconductor memory device referred to herein means, for example, the likes of a chip C storing user data or an electronic device I (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device I comprises the chip C and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unillustrated sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
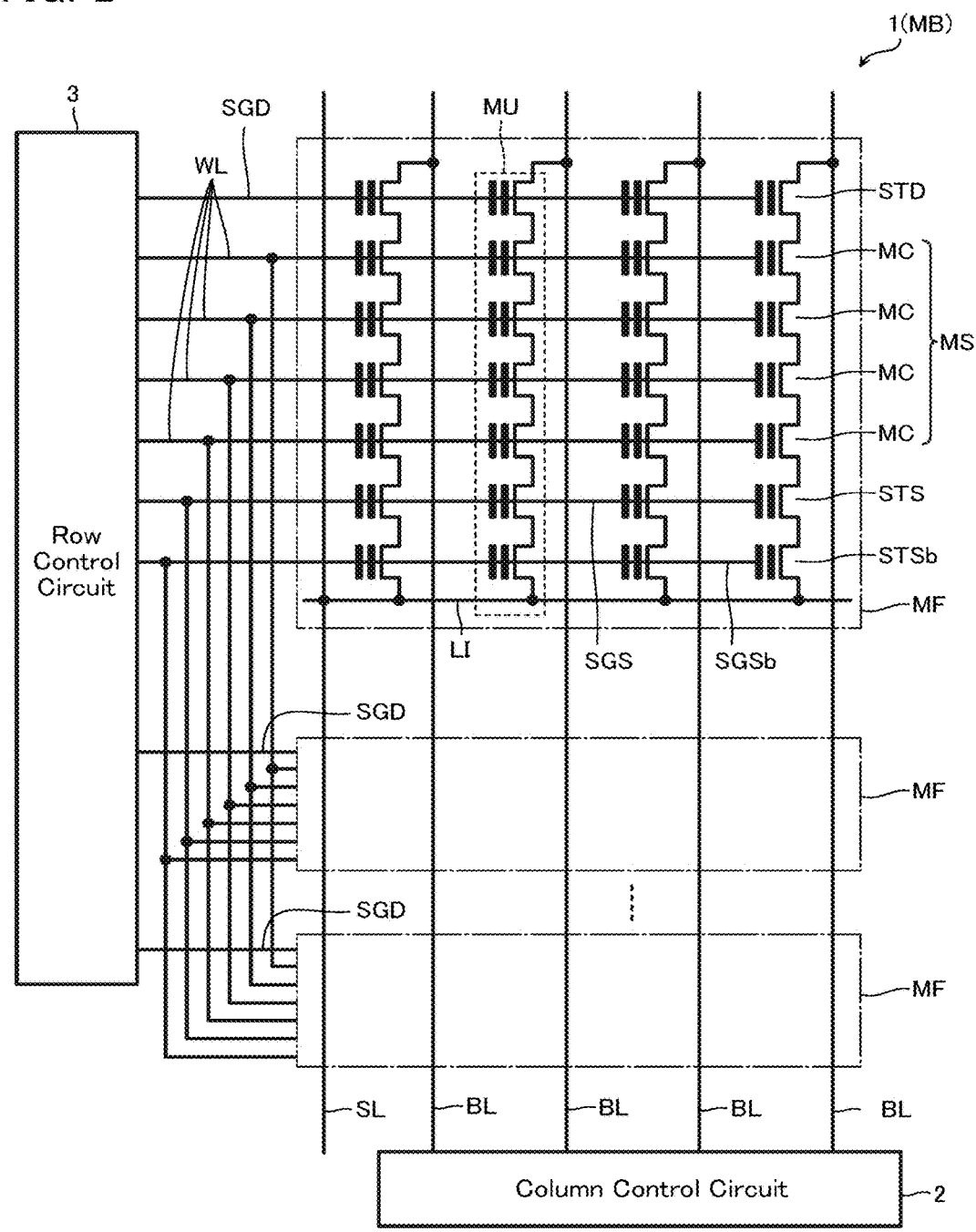
FIG. 2 is a circuit diagram showing a configuration of part of the same nonvolatile semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unillustrated source line driver via a source line SL.

The memory block MB comprises a plurality of memory fingers MF. The memory finger MF comprises a plurality of memory units MU. One ends of these plurality of memory units MU are respectively connected to the bit lines BL. Moreover, the other ends of these plurality of memory units MU are each connected to the source line SL via a common source contact LI. The memory unit MU comprises a drain side select gate transistor STD, a memory string MS, a source side select gate transistor STS, and a lowermost layer source side select gate transistor STSb that are connected in series between the bit line BL and the source contact LI.

The memory string MS comprises a plurality of memory cells MC connected in series. The memory cell MC is a field effect transistor that comprises: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the control gate electrodes of the plurality of memory cells MC belonging to an identical memory string MS are respectively connected to the word lines WL. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. Moreover, respectively connected to the control gate electrodes of the drain side select gate transistor STD, the source side select gate transistor STS, and the lowermost layer source side select gate transistor STSb are a drain side select gate line SGD, a source side select gate line SGS, and a lowermost layer source side select gate line SGSb.

Note that in the description below, the lowermost layer source side select gate transistor STSb, the source side select gate transistor STS, and the drain side select gate transistor STD will sometimes simply be called select gate transistors (STSb, STS, and STD). Moreover, the lowermost layer source side select gate line SGSb, the source side select gate line SGS, and the drain side select gate line SGD will sometimes simply be called select gate lines (SGSb, SGS, and SGD).

Figure 3:
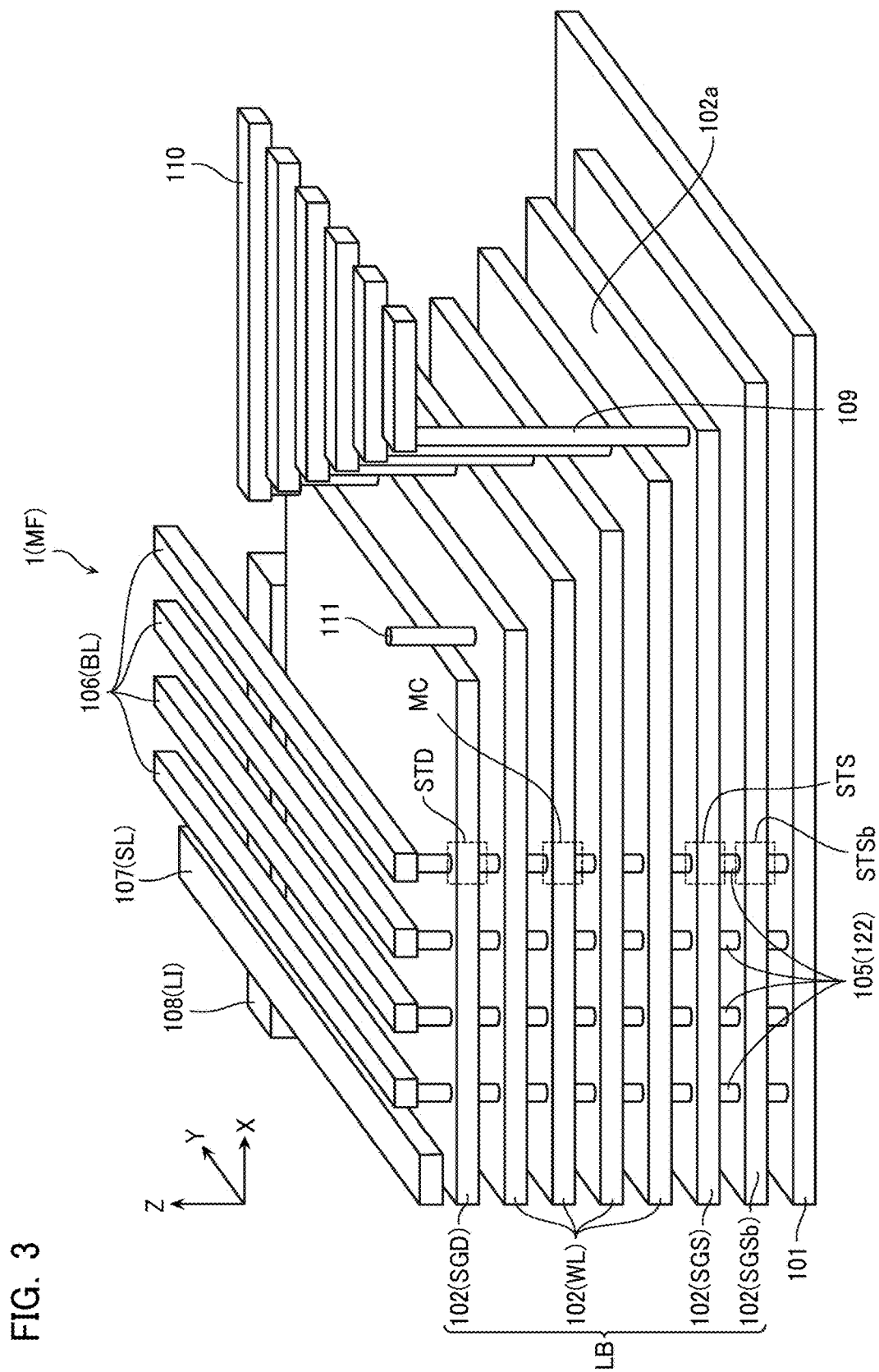
FIG. 3 is a perspective view showing a configuration of part of the same nonvolatile semiconductor memory device.

FIG. 3 is a schematic perspective view showing a configuration of part of the memory finger MF. Note that FIG. 3 explains a three-dimensional structure of a wiring line or the memory cell MC, and so on, and an inter-layer insulating layer provided between the wiring lines, and so on, is not illustrated. In addition, FIG. 3 is illustrated for explanation, and a specific configuration may be appropriately changed. Moreover, in the description below, a certain direction parallel to an upper surface of a substrate 101 is assumed to be an X direction, a direction parallel to the upper surface of the substrate 101 and perpendicular to the X direction is assumed to be a Y direction, and a direction perpendicular to the upper surface of the substrate 101 is assumed to be a Z direction. The description below exemplifies the case where a direction in which the memory string MS extends (first direction) matches the Z direction, but the first direction need not match the Z direction. Furthermore, in the description below, a surface of an object facing the substrate 101 is assumed to be a lower surface of the object, and a surface opposite to the lower surface of the object is assumed to be an upper surface. Additionally, a direction approaching the substrate is assumed to be downward, and a direction going away from the substrate is assumed to be upward.

The memory finger MF includes: the substrate 101; a stacked body LB provided upwardly of the substrate 101; and a substantially columnar memory columnar body 105 whose side surface is covered by the stacked body LB.

The substrate 101 is a semiconductor substrate made of the likes of monocrystalline silicon (Si), for example. The substrate 101 comprises a double well structure that includes an N type impurity layer in a surface of the semiconductor substrate and further includes a P type impurity layer in this N type impurity layer. This P type impurity layer is shown in the drawings. The substrate 101 (P type impurity layer) functions as a channel body of a transistor that has as its control gate electrode a conductive layer 102 in a lowermost layer in the stacked body LB and that electrically connects the memory columnar body 105 and a conductive layer 108.

The stacked body LB includes a plurality of the conductive layers 102 stacked upwardly of the substrate 101. These conductive layers 102 respectively function as the word line WL and control gate electrode of the memory cell MC, or as the select gate line (SGSb, SGS, or SGD) and control gate electrode of the select gate transistor (STSb, STS, or STD). The conductive layer 102 is configured from a conductive layer of the likes of tungsten (W), for example. In addition, the conductive layers 102 each comprise a contact part 102a projecting in the X direction with respect to the conductive layer 102 positioned in a layer above it, and are connected to the row control circuit 3 (FIGS. 1 and 2) via a via contact wiring line 109 connected to a surface of this contact part 102a and via a wiring line 110. Note that the via contact wiring line 109 and the wiring line 110 are configured from a conductive layer of the likes of tungsten (W).

The memory columnar body 105 extends in the Z direction and configures the memory string MS, and so on. That is, an intersection of the conductive layer 102 and the memory columnar body 105 functions as the memory cell MC or as the select gate transistor (STSb, STS, or STD). The memory columnar body 105 includes a semiconductor layer 122 extending in the Z direction. The semiconductor layer 122 faces the plurality of conductive layers 102 and functions as a channel body of the memory cells MC and the select gate transistors (STSb, STS, and STD). A lower end of the semiconductor layer 122 is connected to the unillustrated source line driver, via the substrate 101, via the conductive layer 108 functioning as the source contact 14 and via a conductive layer 107 functioning as the source line SL provided upwardly of the conductive layer 108. An upper end of the semiconductor layer 122 is connected to the column control circuit 2 (FIGS. 1 and 2) via a conductive layer 106 functioning as the bit line BL. Note that the conductive layer 106, the conductive layer 107, and the conductive layer 108 are configured from a conductive layer of the likes of tungsten (W). Moreover, the conductive layer 106 and the conductive layer 107 are arranged in plurality in the X direction and extend in the Y direction. The conductive layer 108 comprises a substantially plate-like shape extending in the X direction and the Z direction along a side surface of the stacked body LB, and is connected at its lower end to the substrate 101.

In addition, the memory finger MF comprises a dummy structure 111. The dummy structure 111 has a columnar shape extending along the Z direction, similarly to the memory columnar body 105. The dummy structure 111 is a support structure that maintains a posture of an unillustrated insulating layer, and so on, provided between the conductive layers 102, in a manufacturing step. Note that the dummy structure 111 may have a structure similar to that of the memory columnar body 105, or may be formed from an insulating layer of the likes of silicon oxide (SiO$_2$), for example.

Figure 4:
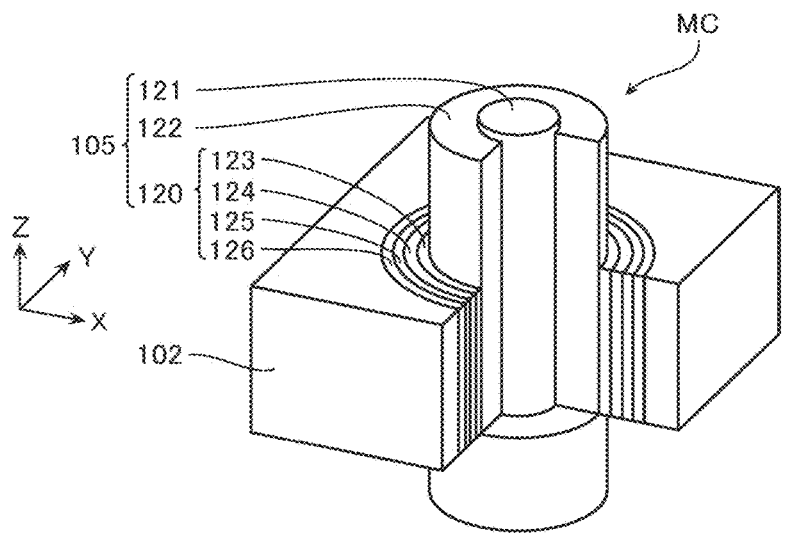
FIG. 4 is a perspective view showing a configuration of part of the same nonvolatile semiconductor memory device.

FIG. 4 is a schematic perspective view showing a configuration of the memory cell MC. Note that FIG. 4 shows the configuration of the memory cell MC, but the select gate transistors (STSb, STS, and STD) may also be configured similarly to the memory cell MC. Note that in FIG. 4, part of the configuration is omitted.

The memory cell MC is provided at an intersection of the conductive layer 102 and the memory columnar body 105. The memory columnar body 105 comprises: a columnar core insulating layer 121 extending in the Z direction; the semiconductor layer 122 covering a side surface of the core insulating layer 121; and a gate insulating layer 120 provided between the conductive layer 102 and the semiconductor layer 122. Moreover, the gate insulating layer 120 comprises: a tunnel insulating layer 123 covering a side surface of the semiconductor layer 122; a charge accumulation layer 124 covering a side surface of the tunnel insulating layer 123; a first block insulating layer 125 covering a side surface of the charge accumulation layer 124; and a second block insulating layer 126 covering a side surface of the first block insulating layer 125.

The core insulating layer 121 is configured from an insulating layer of the likes of silicon oxide (SiO$_2$), for example. The semiconductor layer 122 is configured from a semiconductor layer of the likes of polysilicon, for example, and functions as a channel body of the memory cell MC and the select gate transistors (STSb, STS, and STD). The tunnel insulating layer 123 is configured from an insulating layer of the likes of silicon oxide (SiO$_2$), for example. The charge accumulation layer 124 is configured from an insulating layer capable of accumulating a charge, of the likes of silicon nitride (Si$_3$N$_4$), for example. The first block insulating layer 125 is configured from an insulating layer of the likes of silicon oxide (SiO$_2$), for example. The second block insulating layer 126 is configured from an insulating layer having a high dielectric constant (high dielectric insulating layer). For example, the second block insulating layer 126 includes at least one of an aluminum oxide (AlO$_x$) such as alumina (Al$_2$O$_3$) and hafnium oxide (HfO$_x$). The semiconductor layer 122, the tunnel insulating layer 123, the charge accumulation layer 124, the first block insulating layer 125, and the second block insulating layer 126 have a cylindrical shape extending in the Z direction along the side surface of the core insulating layer 121. However, the semiconductor layer 122 may have a columnar shape, for example.

Figure 5:
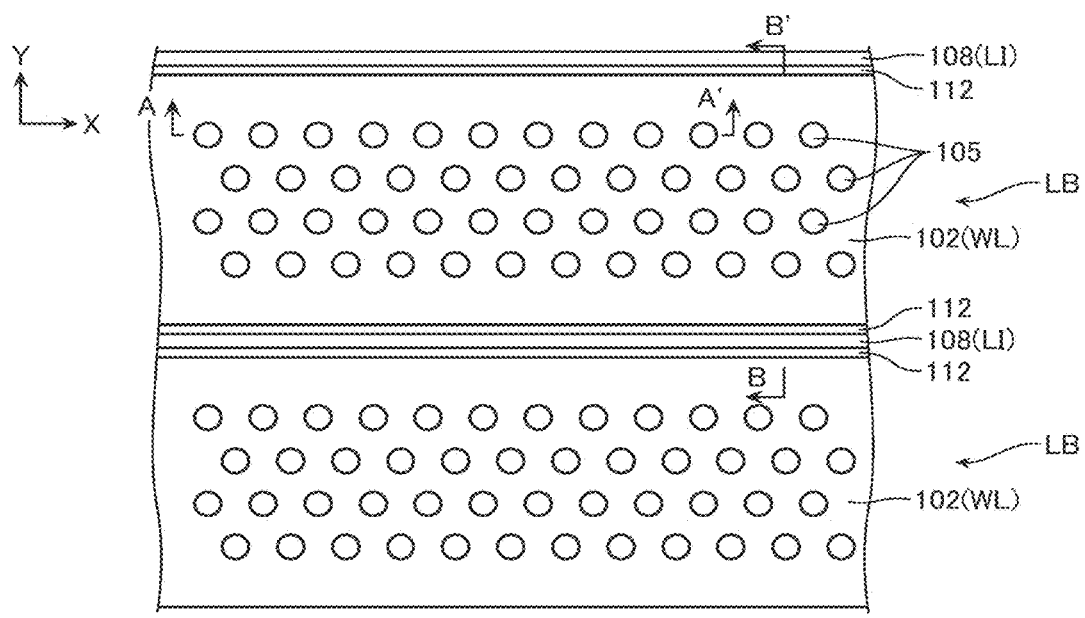
FIG. 5 is a plan view showing a configuration of part of the same nonvolatile semiconductor memory device.
Figure 6:
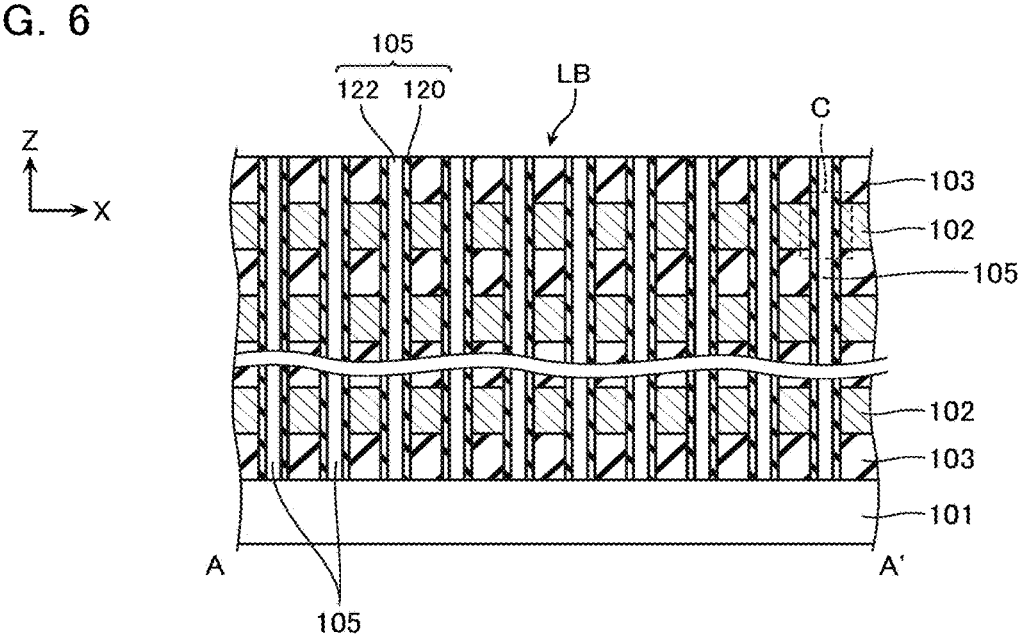
FIG. 6 is a cross-sectional view showing a configuration of part of the same nonvolatile semiconductor memory device.
Figure 7:
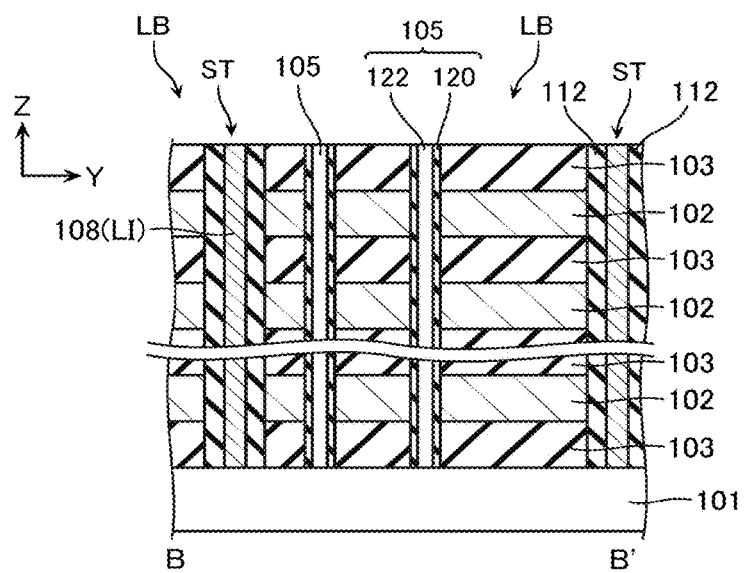
FIG. 7 is a cross-sectional view showing a configuration of part of the same nonvolatile semiconductor memory device.

FIG. 5 is a plan view showing a configuration of part of the nonvolatile semiconductor memory device according to the first embodiment. FIGS. 6 and 7 are cross-sectional views showing configurations of parts of the same nonvolatile semiconductor memory device, and show cross-sections of portions respectively corresponding to the line A-A' and the line B-B' of FIG. 5. Note that FIGS. 5 to 7 are illustrated for explanation, and a specific configuration may be appropriately changed.

As shown in FIG. 5, the stacked body LB extends in the X direction and is arranged in plurality in the Y direction. Moreover, the conductive layer 108 is provided between the stacked bodies LB adjacent in the Y direction, via an insulating layer 112. The insulating layer 112 is configured from an insulating layer of the likes of silicon oxide (SiO$_2$), for example. In addition, the memory columnar bodies 105 are disposed staggered with a certain density. Note that an arrangement of the memory columnar bodies 105 may be appropriately changed to the likes of a triangular arrangement or a square arrangement.

As shown in FIGS. 6 and 7, the stacked body LB comprises an inter-layer insulating layer 103 provided between the plurality of conductive layers 102. The insulating layer 103 is configured from an insulating layer of the likes of silicon oxide ($SiO_2$), for example.

Figure 8:
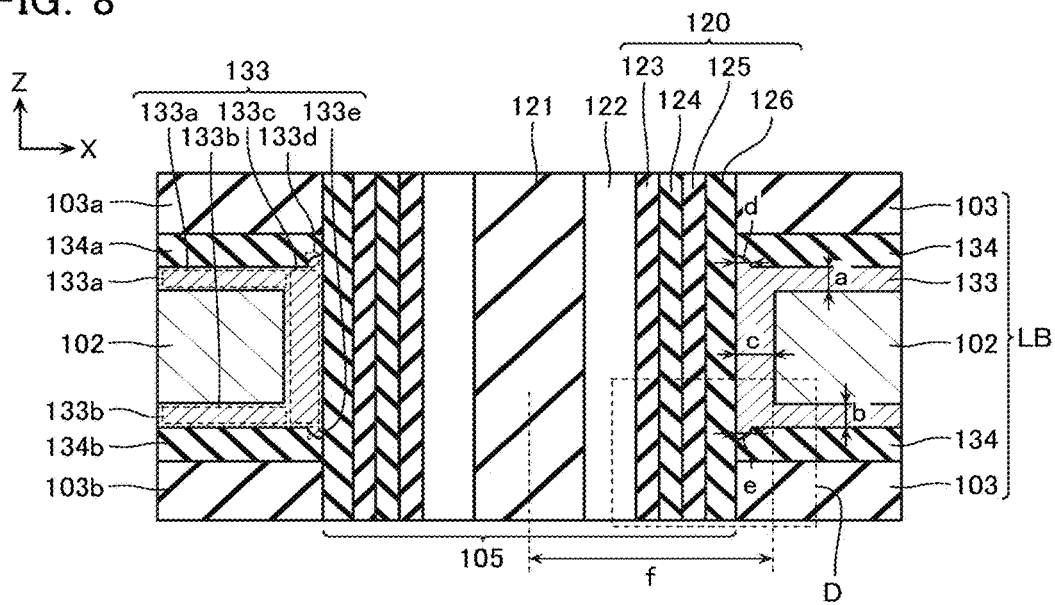
FIG. 8 is a cross-sectional view showing a configuration of part of the same nonvolatile semiconductor memory device.

FIG. 8 is a cross-sectional view showing a configuration of part of the nonvolatile semiconductor memory device according to the present embodiment, and is an enlarged view of the portion indicated by C in FIG. 6. Note that FIG. 8 exemplifies a cross-sectional view in the XZ plane along a central axis of the memory columnar body 105, but a cross-sectional view in another plane (for example, the YZ plane) along the central axis of the memory columnar body 105 is also similar to that of FIG. 8.

The stacked body LB comprises: a barrier metal layer 133 contacting an upper surface, lower surface, and side surface of the conductive layer 102; and a silicon nitride layer 134 contacting an upper surface and lower surface of this barrier metal layer 133.

Next, the barrier metal layer 133 will be described.

The barrier metal layer 133 includes at least one of titanium nitride (TiN), titanium silicon nitride (TiSiN), tantalum nitride (TaN), tantalum silicon nitride (TaSiN), and tungsten nitride (WN), for example, and suppresses diffusion of an impurity such as fluorine included in the conductive layer 102.

The barrier metal layer 133 includes first through fifth barrier metal layers 133a to 133e. The first barrier metal layer 133a contacts an upper surface of the conductive layer 102 (first metal layer). The second barrier metal layer 133b contacts a lower surface of the conductive layer 102 (first metal layer). The third barrier metal layer 133c is formed integrally with these first barrier metal layer 133a and second barrier metal layer 133b, and contacts side surfaces of the conductive layer 102 (first metal layer) and the gate insulating layer 120. The fourth barrier metal layer 133d is formed integrally with this third barrier metal layer 133c. The fourth barrier metal layer 133d projects upwardly along a side surface of the memory columnar body 105 from an upper surface of the third barrier metal layer 133c and contacts the silicon nitride layer 134 and the side surface of the memory columnar body 105. The fifth barrier metal layer 133e is also formed integrally with the third barrier metal layer 133c. The fifth barrier metal layer 133e projects downwardly along the side surface of the memory columnar body 105 from a lower surface of the third barrier metal layer 133c and contacts the silicon nitride layer 134 and the side surface of the memory columnar body 105.

Note that a film thickness "c" in the X direction and the Y direction of the third barrier metal layer 133c is larger than a film thickness "a" in the Z direction of the first barrier metal layer 133a and a film thickness "b" in the Z direction of the second barrier metal layer 133b. Moreover, the film thickness "c" in the X direction and the Y direction of the third barrier metal layer 133c is larger than a film thickness "d" in the X direction and the Y direction of the fourth barrier metal layer 133d and a film thickness "e" in the X direction and the Y direction of the fifth barrier metal layer 133e.

Next, the silicon nitride layer 134 will be described.

The silicon nitride layer 134 is configured from silicon nitride ($Si_3N_4$), for example. The silicon nitride layer 134 includes first and second silicon nitride layers 134a and 134b. The first silicon nitride layer 134a contacts an upper surface of the first barrier metal layer 133a and a lower surface of the inter-layer insulating layer 103 (first inter-layer insulating layer 103a). The second silicon nitride layer 134b contacts a lower surface of the second barrier metal layer 133b and an upper surface of the inter-layer insulating layer 103 (second inter-layer insulating layer 103b). Note that the first silicon nitride layer 134a is positioned upwardly of the second silicon nitride layer 134b and is separated in the Z direction from the second silicon nitride layer 134b.

Note that in the present embodiment, the conductive layer 102, first barrier metal layer 133a, first silicon nitride layer 134a, and first inter-layer insulating layer 103a and the second barrier metal layer 133b, second silicon nitride layer 134b, and second inter-layer insulating layer 103b overlap when viewed from above (the Z direction).

[Advantages of Semiconductor Memory Device]

Figure 9:
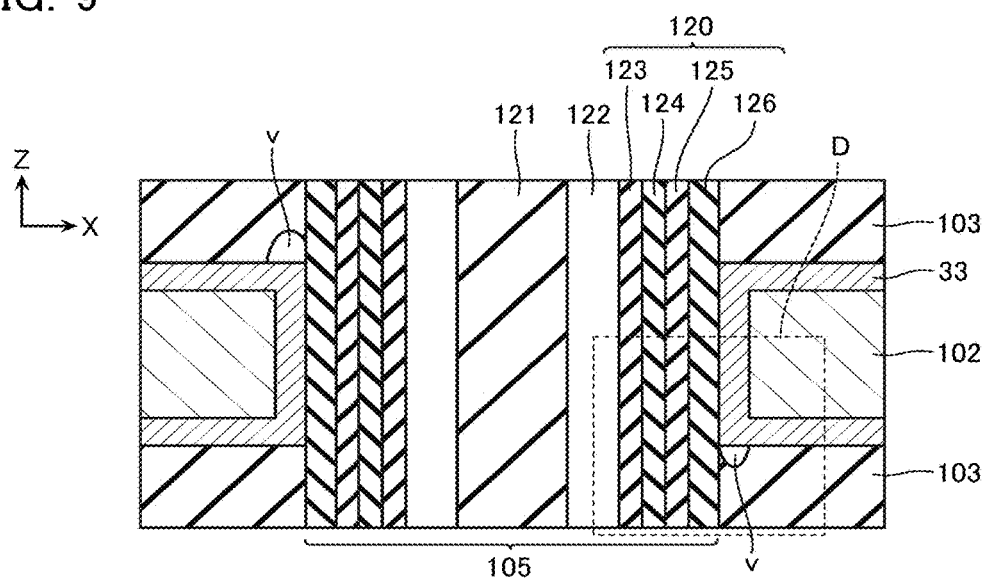
FIG. 9 is a cross-sectional view showing a configuration of part of a nonvolatile semiconductor memory device according to a first comparative example.

FIG. 9 is a cross-sectional view showing a configuration of part of a nonvolatile semiconductor memory device according to a first comparative example. Note that in the description below, portions similar to those of the first embodiment will be assigned with reference symbols identical to those assigned in the first embodiment, and descriptions thereof will be omitted.

The nonvolatile semiconductor memory device according to the first comparative example is basically configured similarly to that of the first embodiment, but does not have the silicon nitride layer 134 provided between a barrier metal layer 33 configured from the likes of titanium nitride (TiN) and the inter-layer insulating layer 103, and in this respect is different from that of the first embodiment.

When, for example, the conductive layer 102 is formed from a metal layer of the likes of tungsten (W), a CVD (Chemical Vapor Deposition) method employing a gas such as tungsten hexafluoride ($WF_6$) is sometimes employed. In such a case, an impurity such as fluorine (F) included in the tungsten hexafluoride sometimes remains in the conductive layer 102. Now, when fluorine in the conductive layer 102 ends up reaching the inter-layer insulating layer 103 by diffusion, it sometimes reacts with moisture to generate fluoric acid and ends up causing a void v or the like to occur in the inter-layer insulating layer 103.

In order to suppress the void v being generated in the inter-layer insulating layer 103, the upper surface, lower surface, and side surface of the conductive layer 102 are covered by the barrier metal layer 33. However, the barrier metal layer 33 is sometimes insufficient. In other words, sometimes, fluorine in the conductive layer 102 ends up passing through the barrier metal layer 33 and the void v ends up being generated.

Accordingly, in the present embodiment, as shown in FIG. 8, the silicon nitride layer 134 is provided between the barrier metal layer 133 and the inter-layer insulating layer 103. The silicon nitride included in the silicon nitride layer 134 is more impermeable to fluorine compared to the likes of silicon oxide configuring the inter-layer insulating layer 103. Therefore, providing the silicon nitride layer 134 makes it possible to suppress fluorine that has passed through the barrier metal layer 133 reaching the inter-layer insulating layer 103, and thereby suitably suppress generation of the void v.

Moreover, in the present embodiment, the first and second silicon nitride layers 134a and 134b are separated from each other, and the third barrier metal layer 133c contacts the side surface of the gate insulating layer 120. Therefore, it becomes possible to provide the silicon nitride layer 134 between the barrier metal layer 133 and the inter-layer insulating layer 103 and suppress generation of the void v, without extending a distance f from a center of the memory columnar body 105 to the conductive layer 102.

[Simulation]

Next, a first simulation performed by the inventors will be described with reference to FIGS. 10 to 12. In the first simulation, a relationship between the void v in the inter-layer insulating layer 103 and a potential in the gate insulating layer 120 was calculated.

Figure 10:
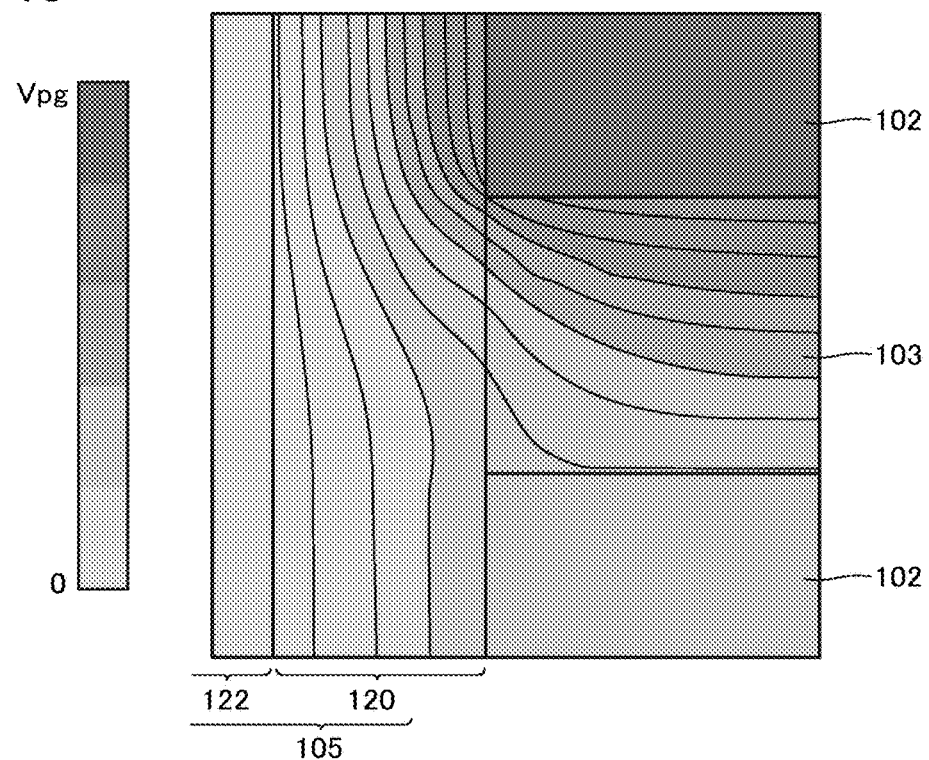
FIGS. 10 and 11 are views showing results of a first simulation.
Figure 11:
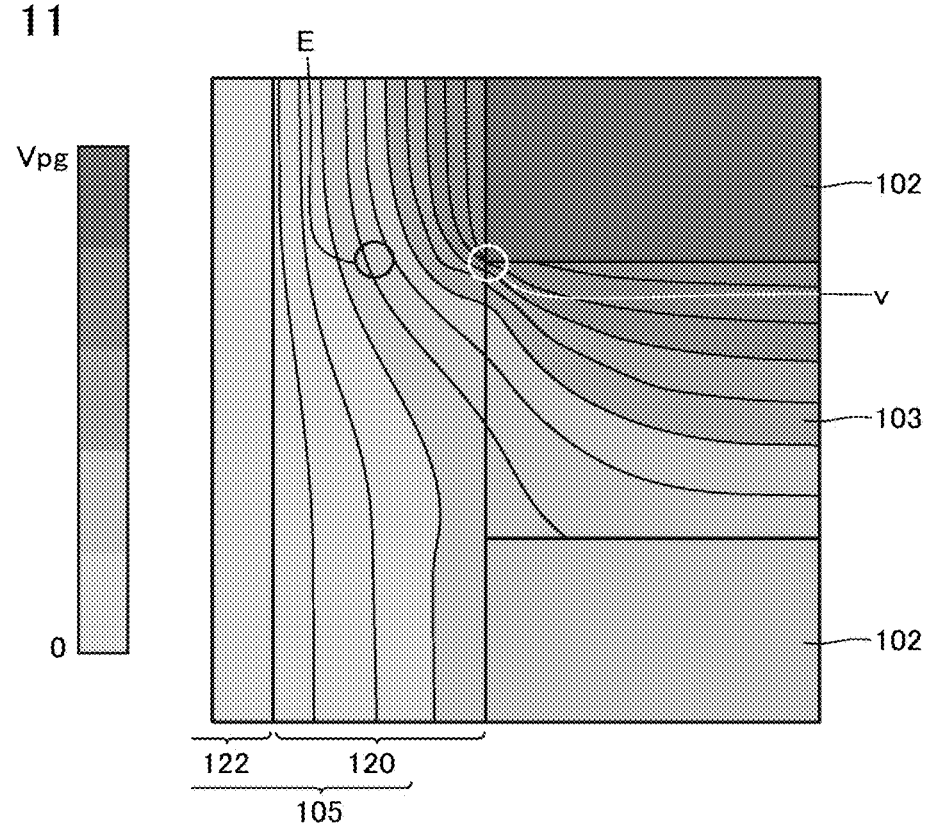

FIGS. 10 and 11 are views showing results of the same simulation, and show close to the portions indicated by D in FIGS. 8 and 9, respectively. Moreover, in FIG. 10 and in FIG. 11, a potential distribution occurring when a voltage Vpg is applied between the semiconductor layer 122 and the conductive layer 102 is shown by equipotential lines. As shown in FIG. 10, when there is no void v in the inter-layer insulating layer 103, a potential in the gate insulating layer 120 lowers comparatively uniformly according to a distance from the conductive layer 102 applied with the voltage Vpg. In contrast, as shown in FIG. 11, when there is the void v in the inter-layer insulating layer 103, the potential in the gate insulating layer 120 is disturbed close to the void v, as indicated by the white circle in FIG. 11.

Figure 12:
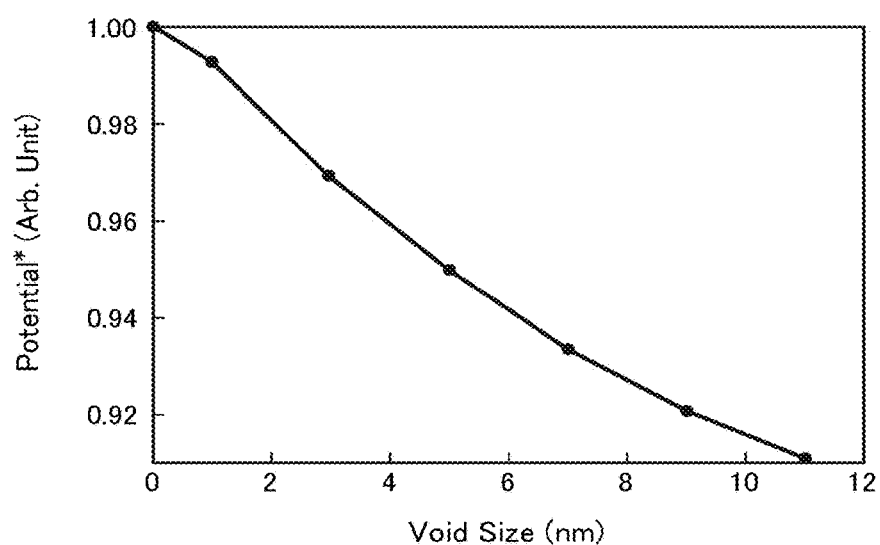
FIG. 12 is a graph showing results of the same simulation.

Moreover, as shown in FIG. 12, the inventors calculated a relationship between a size of the void v and a potential in the portion indicated by E in FIG. 11. FIG. 12 is a graph showing results of the same calculation, the horizontal axis indicating the size of the void v, and the vertical axis indicating a standardized value of the potential in the portion indicated by E in FIG. 11. As shown in FIG. 12, as a result of the same calculation, it was understood that the larger the void v becomes, the more the potential in the portion indicated by E in FIG. 11 ends up lowering.

Now, as explained with reference to FIG. 9, in the nonvolatile semiconductor memory device according to the first comparative example, the void v sometimes ends up being generated in the inter-layer insulating layer 103 by fluorine that has passed through the barrier metal layer 33. In such a case, sometimes, the size of the void v generated becomes ununiform, the potential distribution in the memory columnar body 105 ends up varying, and characteristics of the memory cells MC end up varying.

In contrast, in the nonvolatile semiconductor memory device according to the first embodiment, the silicon nitride layer 134 is provided between the barrier metal layer 133 and the inter-layer insulating layer 103, hence the generation of the fluorine-induced-void is well suppressed.

[Method of Manufacturing]

Figure 13:
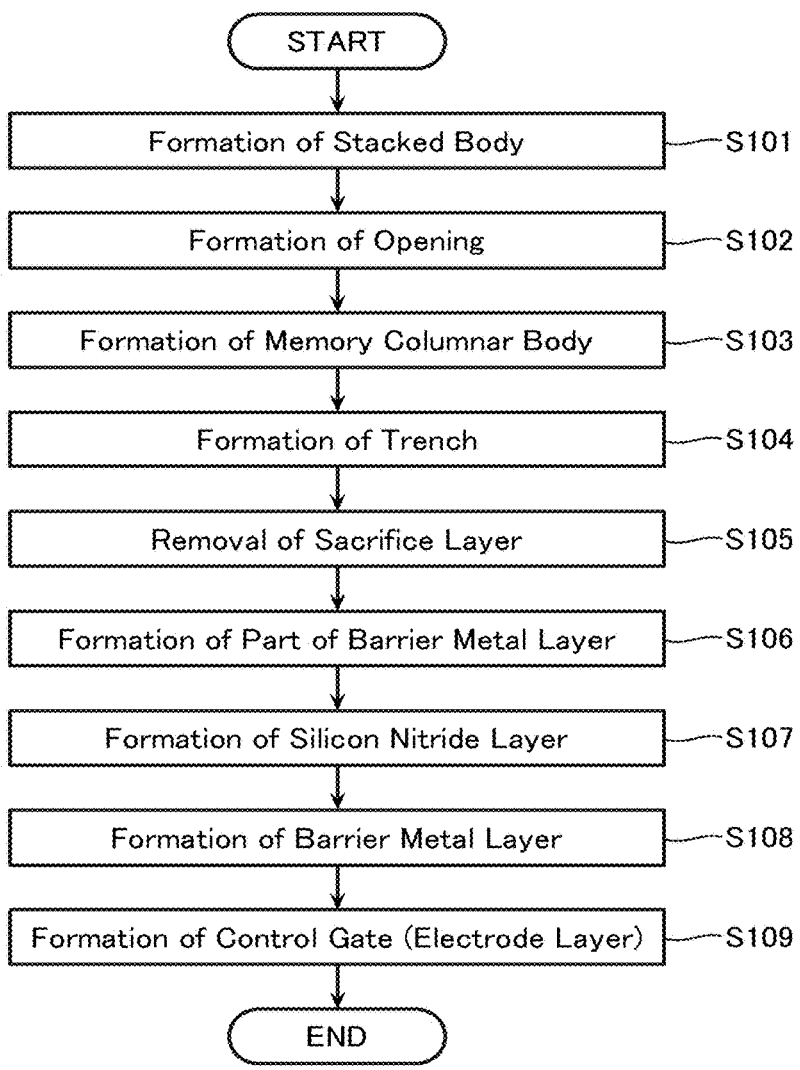
FIG. 13 is a flowchart for explaining a method of manufacturing the nonvolatile semiconductor memory device according to the first embodiment.

FIG. 13 is a flowchart for explaining a method of manufacturing the nonvolatile semiconductor memory device according to the first embodiment. FIGS. 14 to 25 are cross-sectional views for explaining the same method of manufacturing, and each show a cross-section corresponding to a portion corresponding to FIG. 7 or FIG. 8.

Figure 14:
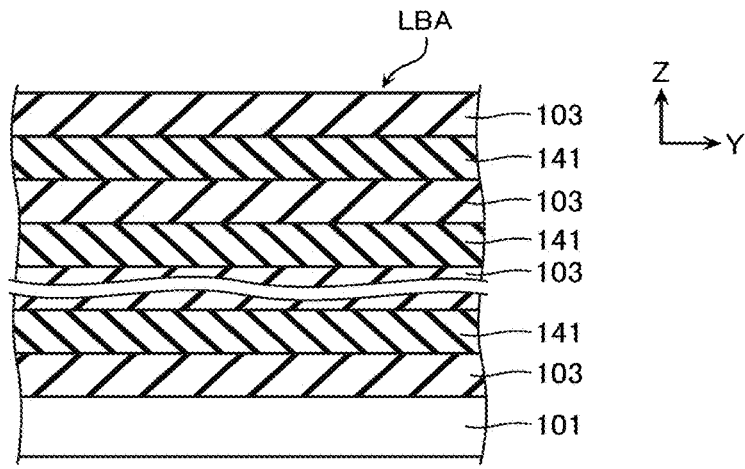
FIGS. 14 to 25 are cross-sectional views for explaining the same method of manufacturing.

As shown in FIGS. 13 and 14, in step S101, a stacked body LBA including a plurality of the inter-layer insulating layers 103 and sacrifice layers 141 is formed on the substrate 101. The inter-layer insulating layer 103 is formed by depositing an insulating layer of the likes of silicon oxide ($SiO_2$), by a method such as CVD (Chemical Vapor Deposition), for example. The sacrifice layer 141 is formed by depositing the likes of silicon nitride ($Si_3N_4$), for example, by a method such as CVD.

Figure 15:
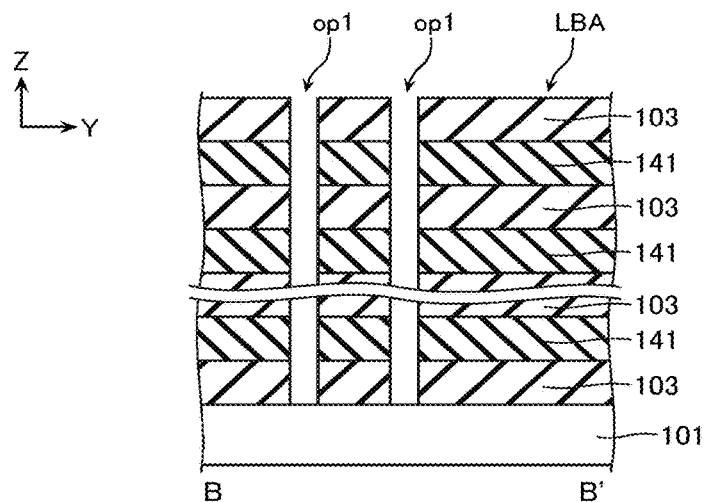
Figure 16:
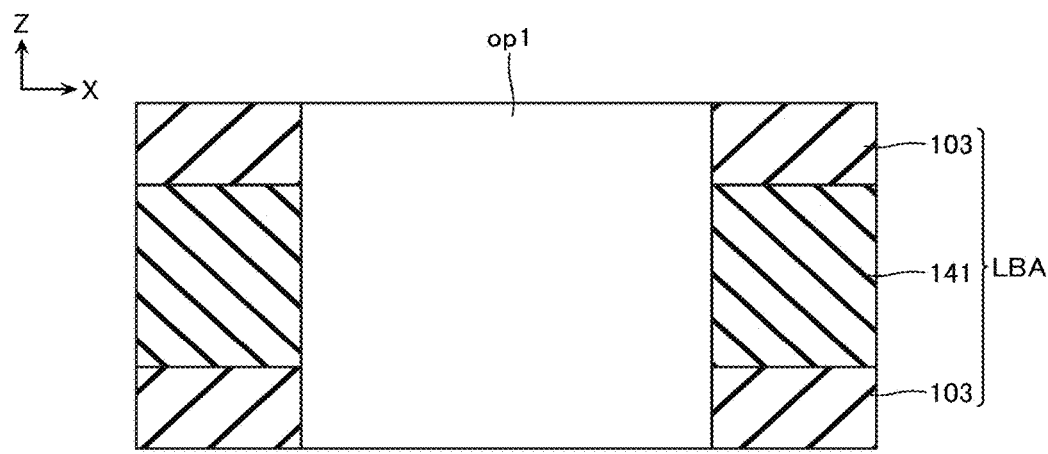

As shown in FIGS. 13, 15, and 16, in step S102, an opening op1 is formed in the stacked body LBA. The opening op1 is a through hole that penetrates the plurality of inter-layer insulating layers 103 and sacrifice layers 141 to expose an upper surface of the substrate 101. The opening op1 is formed by a means such as RIE (Reactive Ion Etching), for example.

Figure 17:
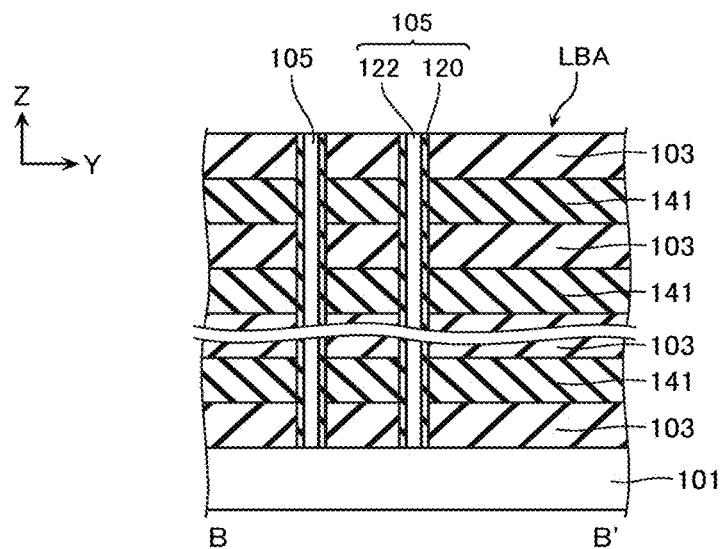
Figure 18:
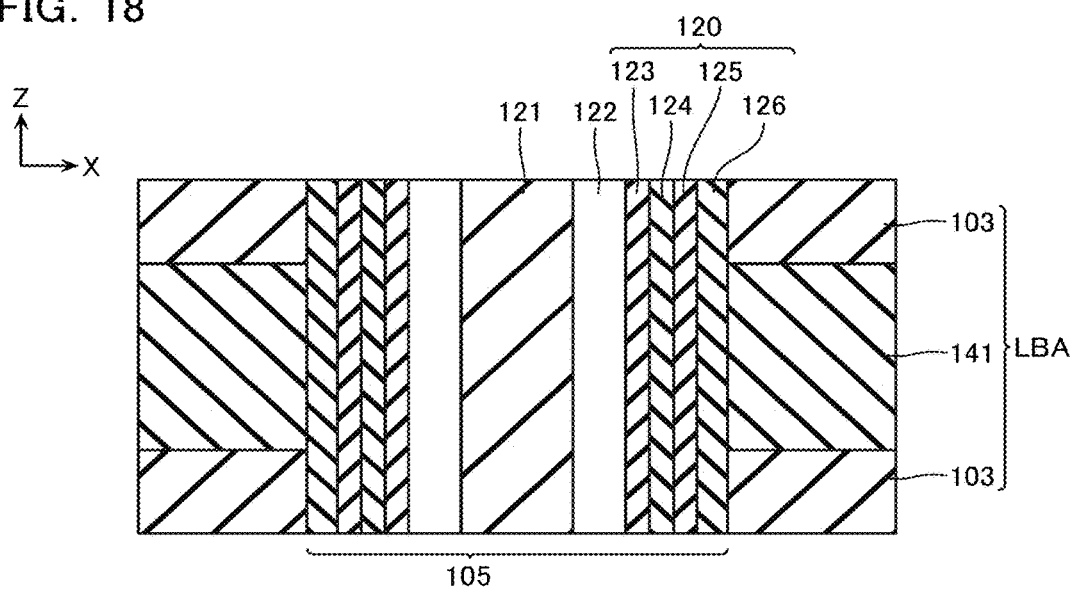

As shown in FIGS. 13, 17, and 18, in step S103, the memory columnar body 105 is formed. For example, the following are formed sequentially on a side surface of the opening op1, namely: alumina ($Al_2O_3$) as the second block insulating layer 126; silicon oxide ($SiO_2$) as the first block insulating layer 125; silicon nitride ($Si_3N_4$) as the charge accumulation layer 124; and silicon oxide ($SiO_2$) as the tunnel insulating layer 123, whereby the gate insulating layer 120 is formed. In addition, polysilicon is formed as the semiconductor layer 122, and silicon oxide ($SiO_2$) is implanted as the core insulating layer 121. Film deposition of the second block insulating layer 126, the first block insulating layer 125, the charge accumulation layer 124, the tunnel insulating layer 123, and the semiconductor layer 122 is performed by a method such as CVD, for example.

Figure 19:
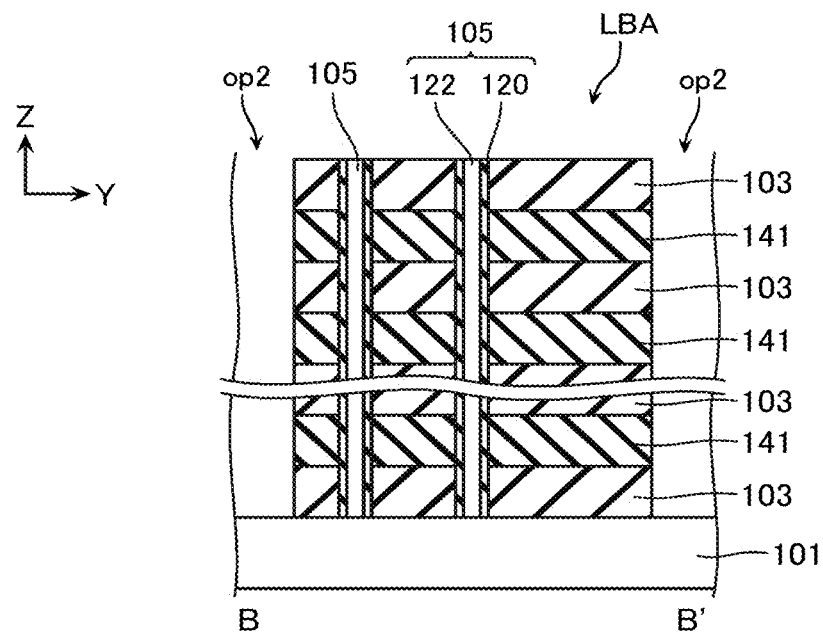

As shown in FIGS. 13 and 19, in step S104, an opening op2 (trench) is formed. The opening op2 is a trench that extends in the X direction and divides the plurality of inter-layer insulating layers 103 and sacrifice layers 141 in the Y direction to expose the upper surface of the substrate 101. The opening op2 is formed by a means such as RIE, for example.

Figure 20:
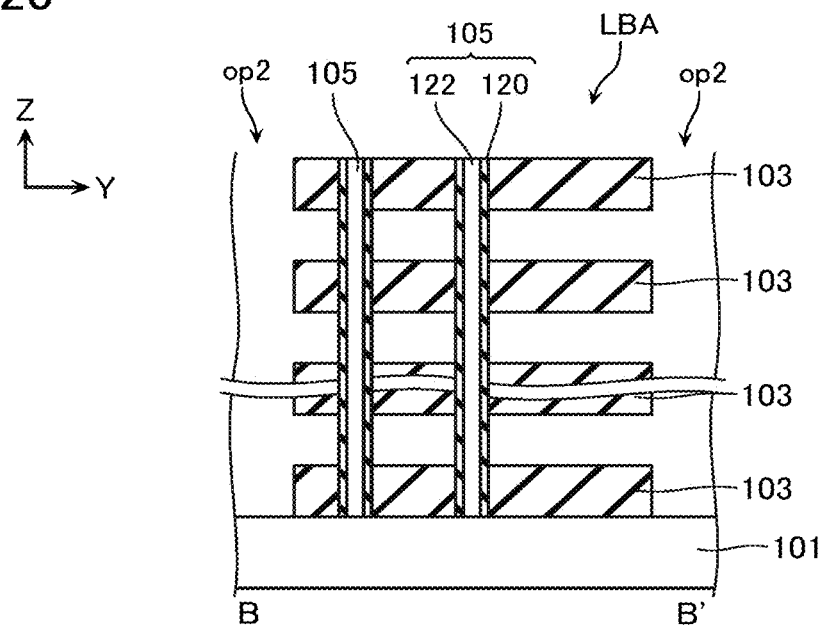
Figure 21:
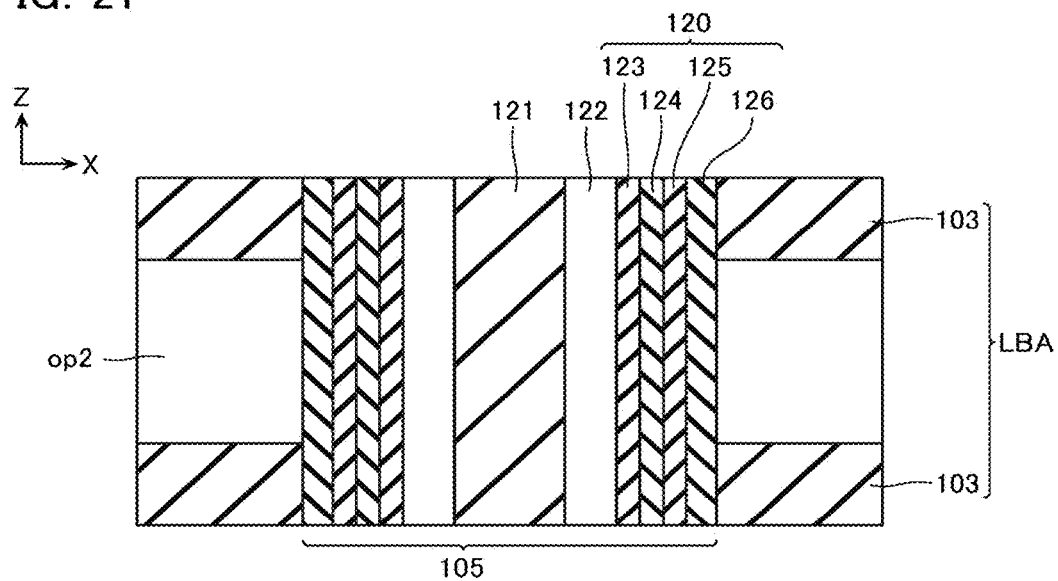

As shown in FIGS. 13, 20, and 21, in step S105, the sacrifice layer 141 is removed via the opening op2. The sacrifice layer 141 is removed by the likes of wet etching using phosphoric acid, for example.

Figure 22:
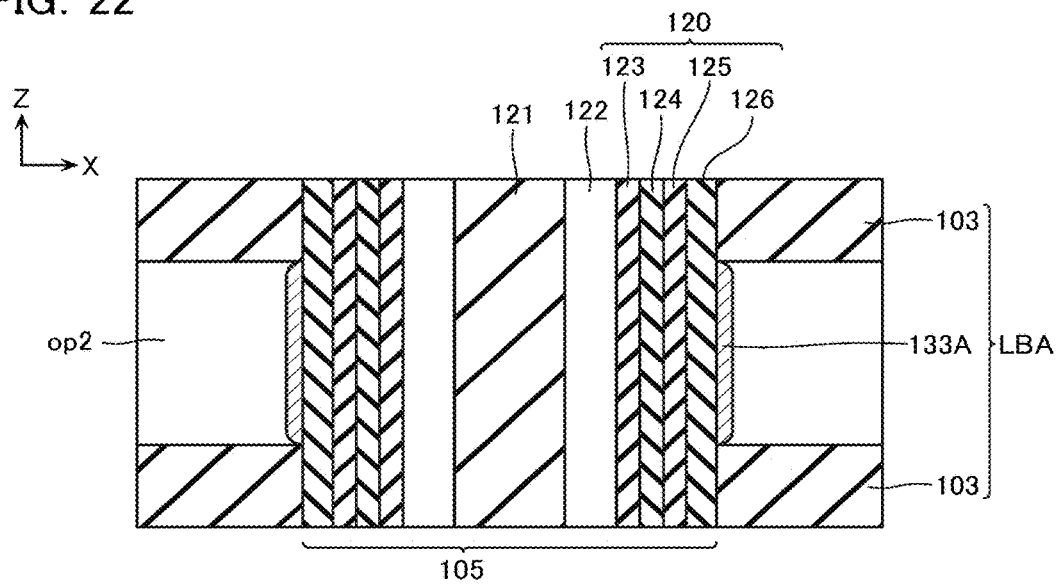

As shown in FIGS. 13 and 22, in step S106, a part 133A of the barrier metal layer 133 is formed. For example, surface processing such as silylation processing is performed via the opening op2. As a result, an incubation time (time from when a gas contacts a surface of a certain configuration to when deposition on this surface begins) at upper and lower surfaces of the inter-layer insulating layer 103 becomes longer than an incubation time at a side surface of the memory columnar body 105. Next, film deposition of the likes of titanium nitride (TiN) is performed, by a means such as CVD, via the opening op2. As a result, titanium nitride, or the like, is selectively deposited on the side surface of the memory columnar body 105, and this titanium nitride, or the like, becomes the part 133A of the barrier metal layer 133. Note that film deposition of this titanium nitride, or the like, can be finished before deposition to the inter-layer insulating layer 103 of titanium nitride, or the like, begins.

Figure 23:
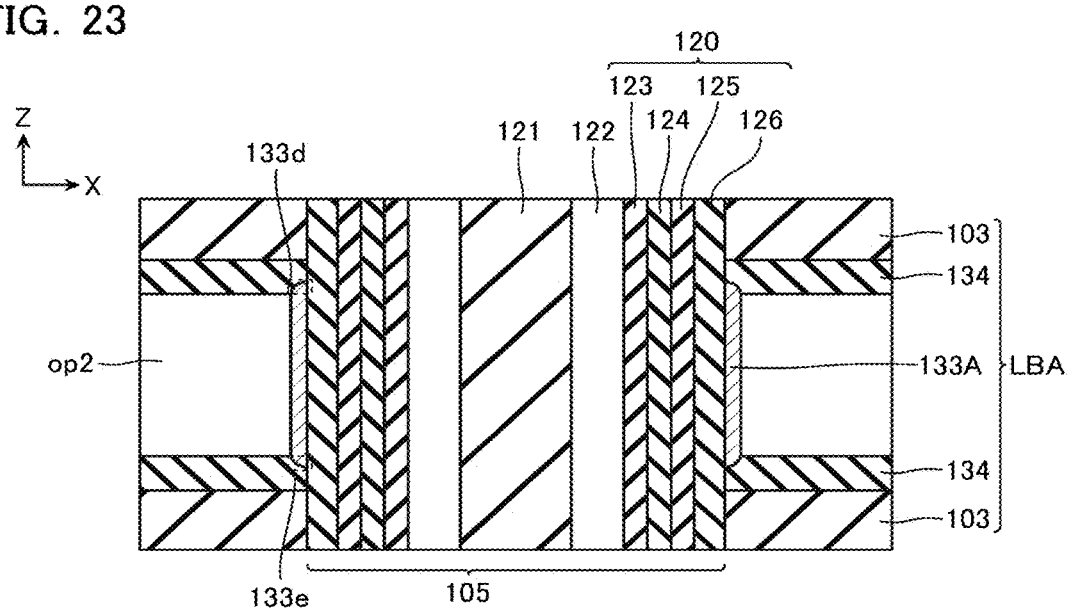

As shown in FIGS. 13 and 23, in step S107, the silicon nitride layer 134 is formed. The silicon nitride layer 134 is formed by nitridation processing that selectively nitridizes part of the inter-layer insulating layer 103. At this time, the side surface of the memory columnar body 105 is protected by the part 133A of the barrier metal layer 133 formed in step S106. Therefore, silicon oxide ($SiO_2$) of the upper surface and the lower surface of the inter-layer insulating layer 103 is selectively nitrided and becomes silicon nitride ($Si_3N_4$). Note that it is also possible to further deposit silicon nitride ($Si_3N_4$) after performing the nitridation processing, for example. An upper surface portion and lower surface portion of the inter-layer insulating layer 103 have their volumes increase by the nitridation processing and grow in the Z direction. As a result, the silicon nitride layer 134 covers a side surface of the part 133A of the barrier metal layer 133. Portions whose side surfaces are covered by the silicon nitride layer 134 will be the fourth barrier metal layer 133d and the fifth barrier metal layer 133e.

Figure 24:
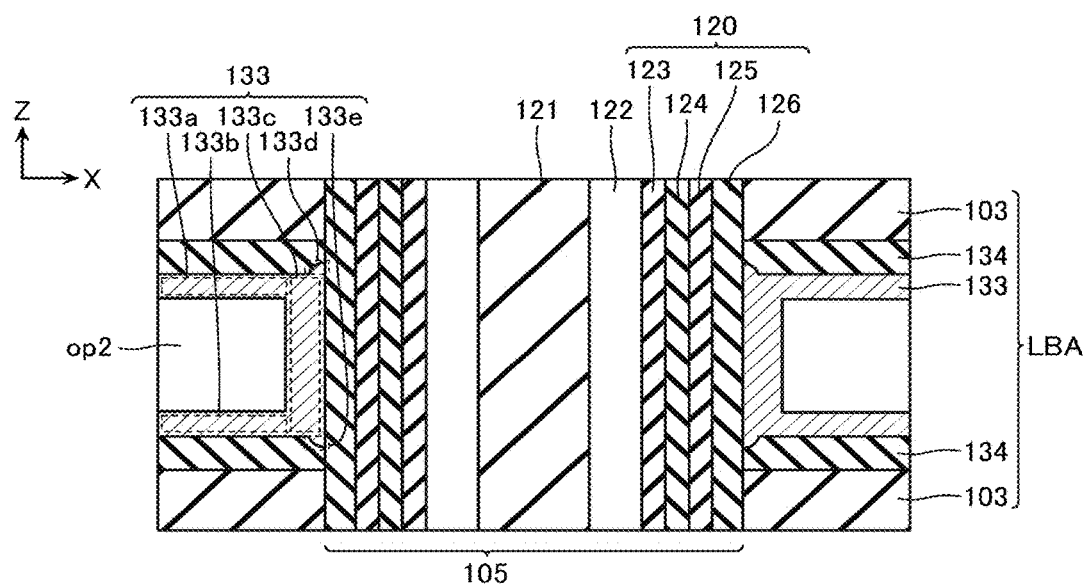

As shown in FIGS. 13 and 24, in step S108, the barrier metal layer 133 is formed. The barrier metal layer 133 is formed by depositing the likes of titanium nitride (TiN), by a means such as CVD, on an upper surface and lower surface of the silicon nitride layer 134 and a side surface of the part 133A of the barrier metal layer 133 formed in step S106, via the opening op2, for example. The first barrier metal layer 133a and the second barrier metal layer 133b are formed on the upper surface and lower surface of the silicon nitride layer 134. The third barrier metal layer 133c is formed on the side surface of the gate insulating layer 120.

Figure 25:
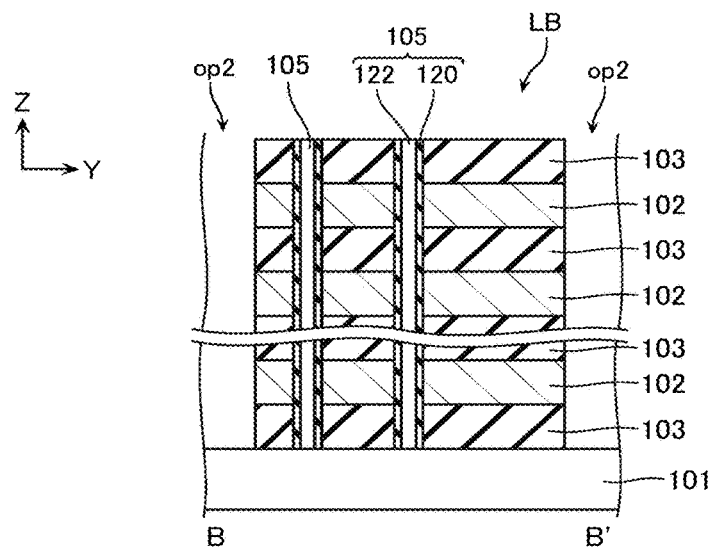

As shown in FIGS. 13, 25, and 8, in step S109, the conductive layer 102 functioning as the control gate electrode of the memory cell MC, and so on, is formed. For example, tungsten (W), or the like, is deposited, by a means such as CVD, on an upper surface, lower surface, and side surface of the barrier metal layer 133, via the opening op2. Furthermore, a spacer insulating layer 112 and the conductive layer 108 are formed, whereby a semiconductor memory device of the kind described with reference to FIGS. 5 to 8 is manufactured.

Note that in the present embodiment, as described with reference to FIGS. 17 and 18, all of layers (the second block insulating layer 126, the first block insulating layer 125, the charge accumulation layer 124, and the tunnel insulating layer 123) configuring the gate insulating layer 120 are formed on the side surface of the opening op1. Such a method makes it possible to more shorten the distance f (refer to FIG. 8) from the center of the memory columnar body 105 to the conductive layer 102, compared to when part of the gate insulating layer 120 is deposited via the opening op2. Therefore, in step S109, it is possible to lengthen a distance in the XY plane of fellow memory columnar bodies 105, and thereby suitably deposit the conductive layer 102. Note that in the configuration manufactured by such a method, the gate insulating layer 120 (the tunnel insulating layer 123, the charge accumulation layer 124, the first block insulating layer 125, and the second block insulating layer 126) has a cylindrical shape extending in the Z direction, and is provided between the plurality of conductive layers 102 and the semiconductor layer 122.

Second Embodiment

[Configuration of Semiconductor Memory Device]

Figure 26:
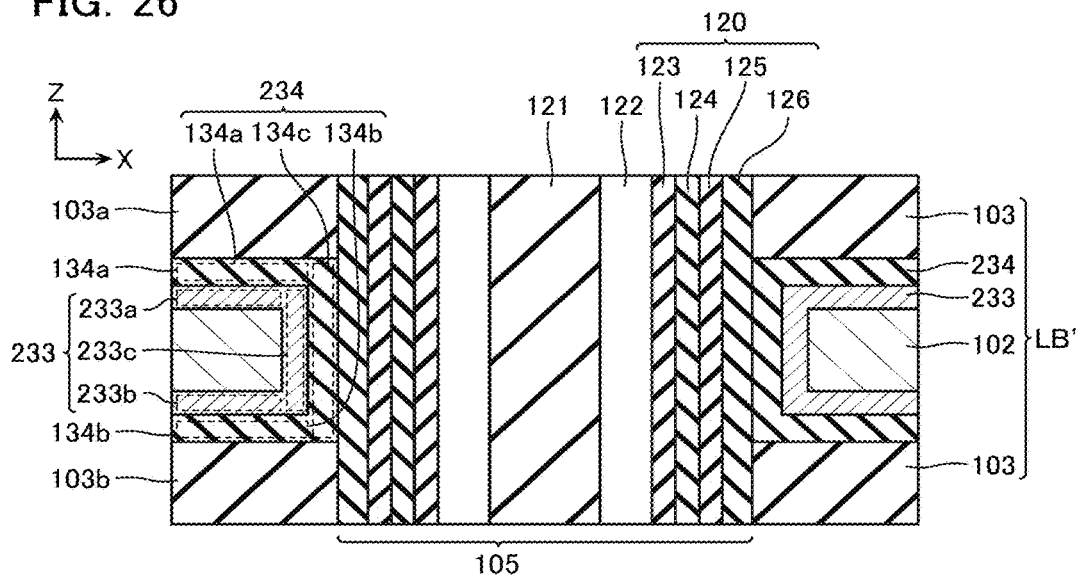
FIG. 26 is a cross-sectional view showing a configuration of part of a nonvolatile semiconductor memory device according to a second embodiment.

FIG. 26 is a schematic cross-sectional view for explaining a nonvolatile semiconductor memory device according to a second embodiment, and shows a portion corresponding to FIG. 8 (a portion corresponding to C in FIG. 6). Note that in the description below, portions similar to those of the first embodiment will be assigned with reference symbols identical to those assigned in the first embodiment, and descriptions thereof will be omitted.

The nonvolatile semiconductor memory device according to the present embodiment is basically configured similarly to the nonvolatile semiconductor memory device according to the first embodiment, but has a configuration of a barrier metal layer 233 and a silicon nitride layer 234 included in a stacked body LB' which is different from a configuration of the barrier metal layer 133 and the silicon nitride layer 134 according to the first embodiment. That is, in the stacked body LB' according to the second embodiment, an upper surface, lower surface, and side surface of the barrier metal layer 233 contact the silicon nitride layer 234, an upper surface and lower surface of this silicon nitride layer 234 contact the inter-layer insulating layer 103, and a side surface of this silicon nitride layer 234 contacts the gate insulating layer 120.

The barrier metal layer 233 includes at least one of titanium (Ti), titanium nitride (TiN), titanium silicon nitride (TiSiN), tantalum (Ta), tantalum nitride (TaN), tantalum silicon nitride (TaSiN), and tungsten nitride (WN), for example, and suppresses diffusion of an impurity such as fluorine included in the conductive layer 102. Moreover, the barrier metal layer 233 includes first through third barrier metal layers 233a to 233c. The first barrier metal layer 233a contacts the upper surface of the conductive layer 102 (first metal layer). The second barrier metal layer 233b contacts the lower surface of the conductive layer 102 (first metal layer). The third barrier metal layer 233c contacts the side surface of the conductive layer 102 (first metal layer). Note that these first through third barrier metal layers 233a to 233c are formed integrally.

The silicon nitride layer 234, in addition to comprising the first silicon nitride layer 134a and the second silicon nitride layer 134b described with reference to FIG. 8, comprises also a third silicon nitride layer 134c which is provided between the gate insulating layer 120 and the conductive layer 102 and contacts the side surface of the gate insulating layer 120 and the side surface of the barrier metal layer 233. Note that the first through third silicon nitride layers 134a to 134c are formed integrally.

Note that the conductive layer 102, first barrier metal layer 233a, first silicon nitride layer 134a, and first inter-layer insulating layer 103a and the second barrier metal layer 233b, second silicon nitride layer 134b, and second inter-layer insulating layer 103b overlap when viewed from above (the Z direction).

[Advantages of Semiconductor Memory Device]

As described with reference to FIG. 8, in the first embodiment, the side surface of the barrier metal layer 133 configured from the likes of titanium nitride (TiN) contacts the side surface of the gate insulating layer 120, that is, the side surface of the second block insulating layer 126 configured from the likes of alumina (Al$_2$O$_3$). Now, it sometimes occurred that when atoms having a strong reducing power such as titanium (Ti) or tantalum (Ta) included in the barrier metal layer 133 moved into the second block insulating layer 126 by diffusion, an oxygen deficiency occurred locally, whereby a leak path was formed in the second block insulating layer 126 and a leak current was caused.

Accordingly, in the present embodiment, as shown in FIG. 26, the silicon nitride layer 234 is provided between the barrier metal layer 233 and the second block insulating layer 126. This makes it possible to prevent atoms having a strong reducing power such as titanium (Ti) or tantalum (Ta) from moving into the second block insulating layer 126, thereby suitably suppressing occurrence of a leak current.

Figure 27:
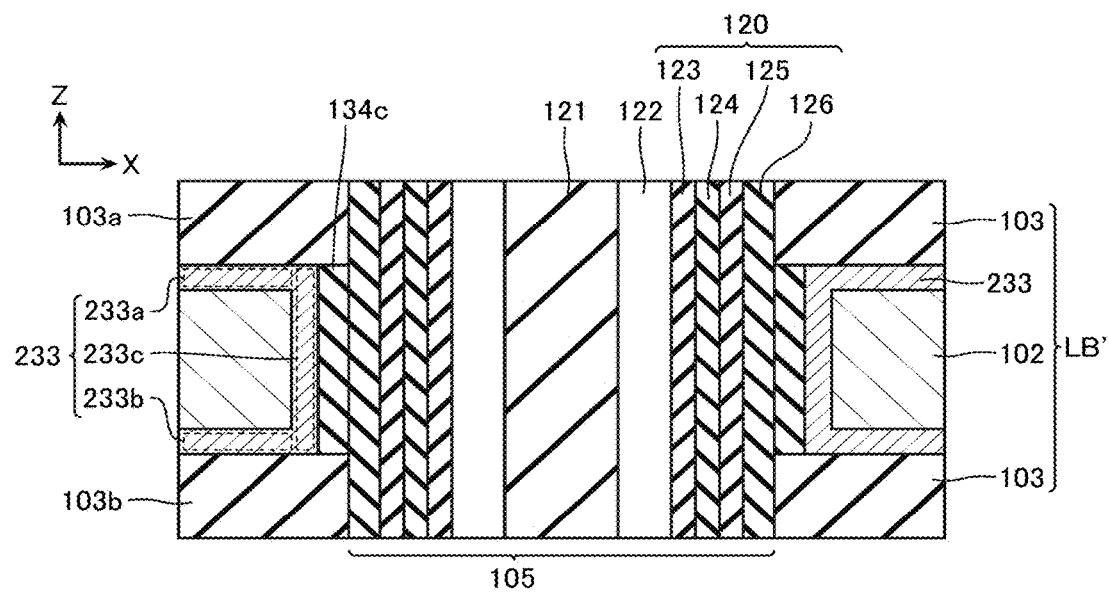
FIG. 27 is a cross-sectional view showing another configuration example of the same nonvolatile semiconductor memory device.

Note that in the example shown in FIG. 26, the silicon nitride layer 234 comprises the first silicon nitride layer 134a and the second silicon nitride layer 134b contacting the upper and lower surfaces of the barrier metal layer 233 and the upper and lower surfaces of the inter-layer insulating layer 103. However, as shown in FIG. 27, for example, in order to prevent occurrence of a leak current accompanying movement of titanium or the like, there need only be the third silicon nitride layer 134c contacting the side surfaces of the barrier metal layer 233 and the gate insulating layer 120, and the first silicon nitride layer 134a and the second silicon nitride layer 134b may be omitted. In this case, for example, the first barrier metal layer 233a contacts the lower surface of the inter-layer insulating layer 103 (first inter-layer insulating layer 103a), and the second barrier metal layer 233b contacts the upper surface of the inter-layer insulating layer 103 (second inter-layer insulating layer 103b).

[Simulations]

Next, results of a second simulation performed by the inventors will be described with reference to FIGS. 28 to 30. In the second simulation, it was calculated what degree of film thickness the silicon nitride layer 234 should have in order to suitably suppress occurrence of a leak current.

Figure 28:
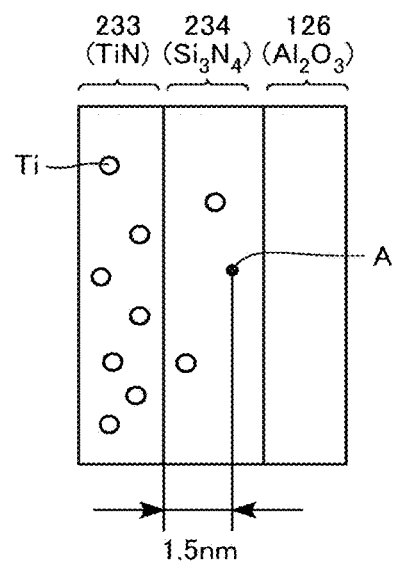
FIG. 28 is a view showing results of a second simulation.

FIG. 28 is a schematic view for explaining the same simulation, and shows a state of titanium atoms Ti in the barrier metal layer 233, the silicon nitride layer 234, and the second block insulating layer 126. Titanium atoms Ti in the barrier metal layer 233 sometimes move into the silicon nitride layer 234 or the second block insulating layer 126 by diffusion. Now, such movement of titanium atoms Ti occurs frequently during annealing processing. Therefore, during calculation, it was assumed that annealing processing was performed for 30 minutes on a structure in which the silicon nitride layer 234 was provided on the side surface of the barrier metal layer 233. Moreover, the calculation calculated concentration of titanium atoms at point A separated by 1.5 nm from a boundary surface with the barrier metal layer 233, in the silicon nitride layer 234.

Figure 29:
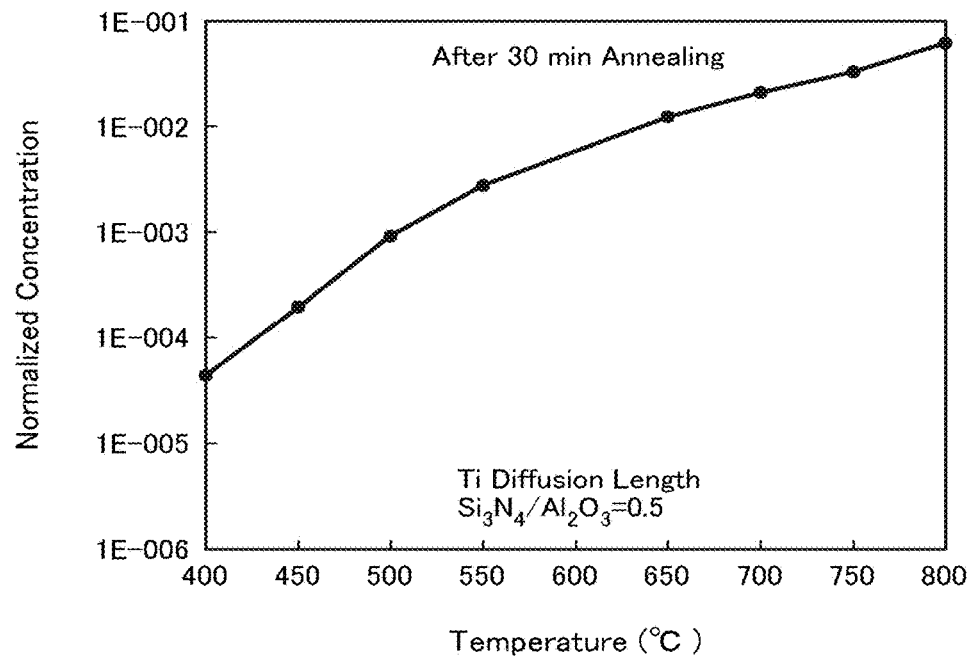
FIGS. 29 and 30 are graphs showing results of the same simulation.
Figure 30:
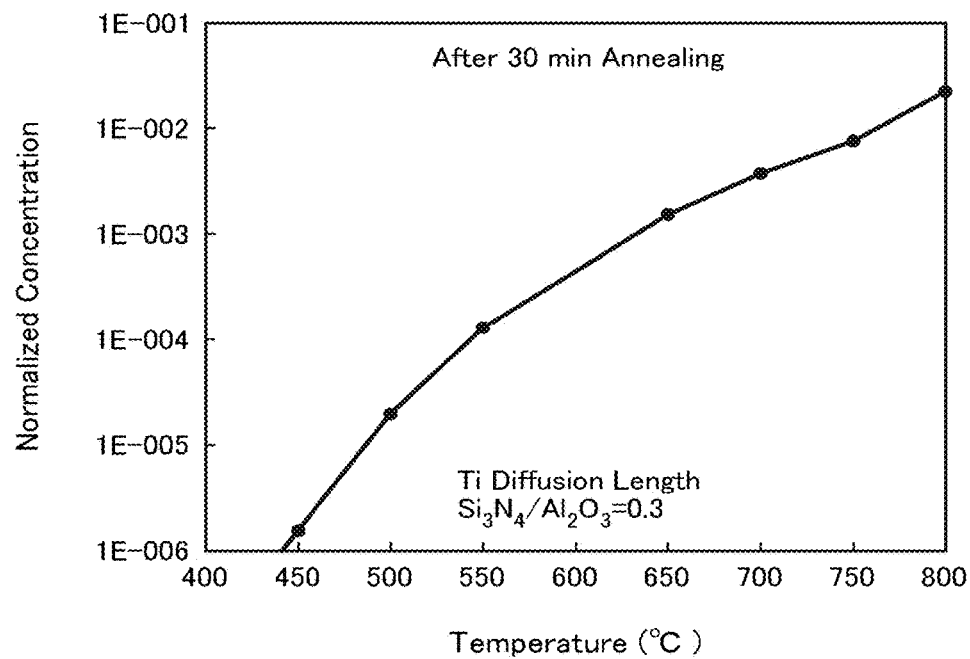

FIGS. 29 and 30 are graphs showing results of this calculation, the vertical axis indicating normalized concentration of titanium atoms, and the horizontal axis indicating temperature in the annealing processing. Moreover, the calculation corresponding to FIG. 29 was performed assuming a diffusion length of titanium atoms in silicon nitride to be about 0.5 times a diffusion length of titanium atoms in alumina. Furthermore, the calculation corresponding to FIG. 30 was performed assuming a diffusion length of titanium atoms in silicon nitride to be about 0.3 times a diffusion length of titanium atoms in alumina.

As shown in FIGS. 29 and 30, the higher the temperature of annealing processing is, the more the titanium concentration at point A increases. This indicates that the higher the temperature of annealing processing, the larger the number of titanium atoms that move into the silicon nitride layer 234. Now, as shown in FIGS. 29 and 30, in a range that the simulation was performed, the titanium concentration at point A is smaller than 1E-001 (=1×10$^{-1}$). This means that at point A separated by 1.5 nm from a boundary surface with the barrier metal layer 233, in the silicon nitride layer 234, titanium atoms are substantially non-existent. Therefore, it is expected that if a film thickness (for example, a film thickness in the X direction or a film thickness in the Y direction) of the silicon nitride layer 234 is set to 1.5 nm or more, for example, then movement into the second block insulating layer 126 of titanium atoms is suppressed, whereby occurrence of a leak current can be suitably suppressed.

Next, results of a third simulation performed by the inventors will be described with reference to FIGS. 31 and 32. In the second simulation, it was expected that if the film thickness of the silicon nitride layer 234 (refer to FIG. 26) was set to 1.5 nm or more, then movement into the second block insulating layer 126 of titanium atoms could be suppressed. On the other hand, sometimes, when the film thickness of the silicon nitride layer 234 gets too large, electrostatic capacitance between the channel body (semiconductor layer 122) and the control gate electrode (conductive layer 102) of the memory cell MC lowers, which ends up leading to the likes of an increase in power consumption or a malfunction. Accordingly, in the third simulation, a relationship between the film thickness of the silicon nitride layer 234 and electrostatic capacitance in the silicon nitride layer 234 and second block insulating layer 126 (high dielectric insulating layer), was calculated.

Figure 31:
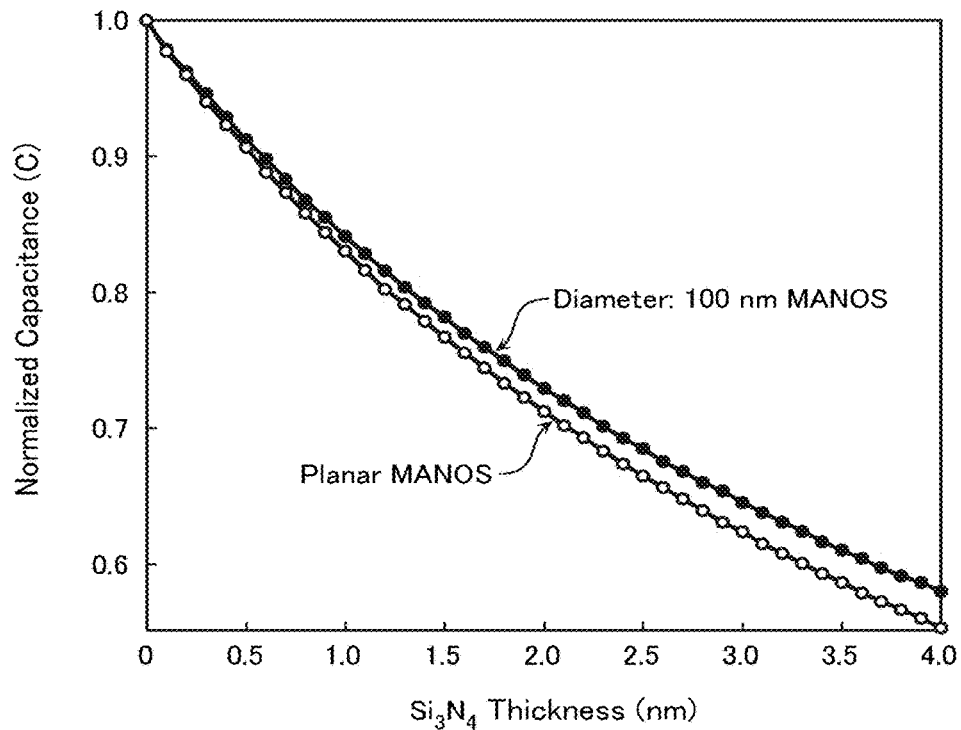
FIGS. 31 and 32 are graphs showing results of a third simulation.
Figure 32:
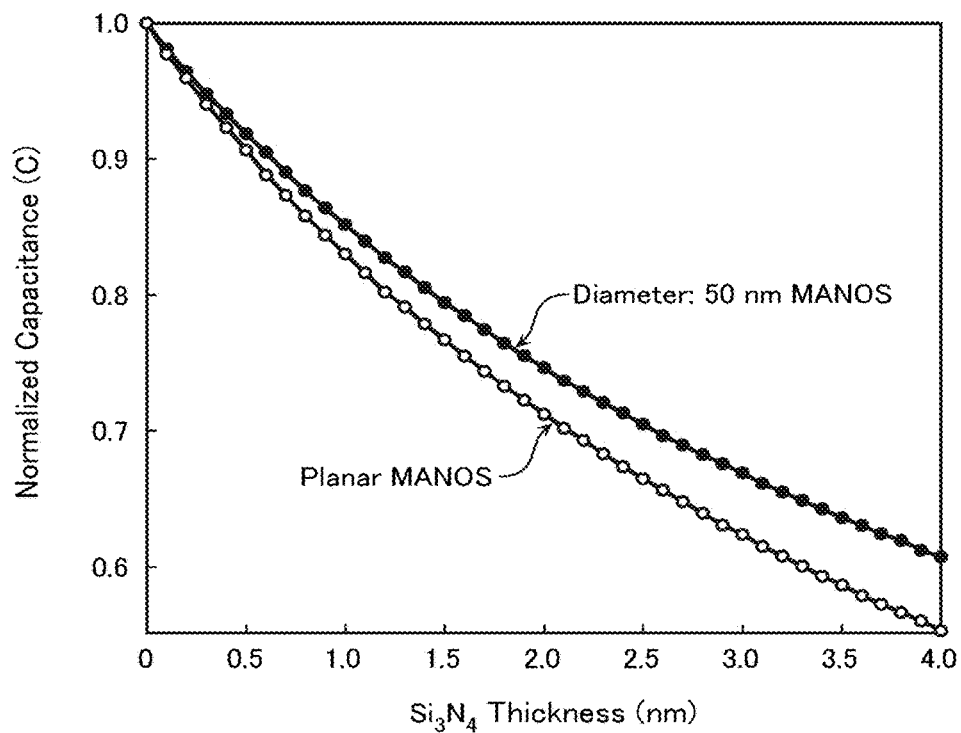

FIGS. 31 and 32 are graphs showing results of the same calculation, the vertical axis indicating a standardized value of the above-described electrostatic capacitance, and the horizontal axis indicating the film thickness of the silicon nitride layer 234. Note that this calculation was performed assuming a film thickness of the second block insulating layer 126 to be 6 nm. Moreover, in the calculation corresponding to FIG. 31, an outer diameter of the gate insulating layer 120 was set to 100 nm; and in the calculation corresponding to FIG. 32, the outer diameter of the gate insulating layer 120 was set to 50 nm. Note that as shown in FIGS. 31 and 32, for comparison, calculation of electrostatic capacitance was performed also for the case where the silicon nitride layer 234 and the second block insulating layer 126 are formed in a planar shape, in addition to the case where they are formed in a cylindrical shape.

As shown in FIG. 31, the more the film thickness of the silicon nitride layer 234 increases, the smaller the above-described electrostatic capacitance becomes. For example, when the film thickness of the silicon nitride layer 234 is about 1.5 nm, electrostatic capacitance has lowered to about 79% compared to when the film thickness of the silicon nitride layer 234 is 0 nm (when the silicon nitride layer 234 is not provided). Moreover, when, for example, the film thickness of the silicon nitride layer 234 is about 2.0 nm, electrostatic capacitance has lowered to about 72% compared to when the film thickness of the silicon nitride layer 234 is 0 nm. At least in such a range, the nonvolatile semiconductor memory device can be suitably operated. In other words at least when the outer diameter of the gate insulating layer 120 is 100 nm or less and the film thickness of the silicon nitride layer 234 is 2.0 nm or less, the nonvolatile semiconductor memory device can be suitably operated.

In addition, when the silicon nitride layer 234 and the second block insulating layer 126 are formed in a cylindrical shape, a decrement of electrostatic capacitance accompanying an increase in film thickness of the silicon nitride layer 234 was smaller compared to when the silicon nitride layer, and so on, are of a planar shape. Therefore, it was understood that a lowering of electrostatic capacitance accompanying an increase in film thickness of the silicon nitride layer 234 can be suppressed by forming the silicon nitride layer 234 and the second block insulating layer 126 in a cylindrical shape.

Moreover, as shown in FIGS. 31 and 32, when the outer diameter of the gate insulating layer 120 is 50 nm, the decrement of electrostatic capacitance accompanying an increase in film thickness of the silicon nitride layer 234 was smaller than when the outer diameter of the gate insulating layer 120 is 100 nm. Therefore, it was understood that the lowering of electrostatic capacitance accompanying an increase in film thickness of the silicon nitride layer 234 can be more suppressed when the outer diameter of the gate insulating layer 120 is small. Therefore, it is understood that even supposing there is variation in the outer diameter of the gate insulating layer 120, variation in electrostatic capacitance accompanying the variation in outer diameter of the gate insulating layer 120 is more suppressed when the outer diameter of the gate insulating layer 120 is small overall.

Now, as shown in FIG. 26, in the present embodiment, all of the layers (the tunnel insulating layer 123, the charge accumulation layer 124, the first block insulating layer 125, and the second block insulating layer 126) configuring the gate insulating layer 120 have a cylindrical shape extending in the Z direction and are provided between the plurality of conductive layers 102 and the semiconductor layer 122. As described with reference to FIGS. 17 and 18, such a configuration makes it possible to manufacture by forming all of the layers configuring the gate insulating layer 120 on the side surface of the opening op1, and makes it possible to make the outer diameter of the gate insulating layer 120 smaller compared to when part of the gate insulating layer 120 is deposited via the opening op2. Therefore, lowering of electrostatic capacitance between the semiconductor layer 122 and the control gate electrode can be suppressed, and variation of electrostatic capacitance can be reduced.

[Method of Manufacturing]

Figure 33:
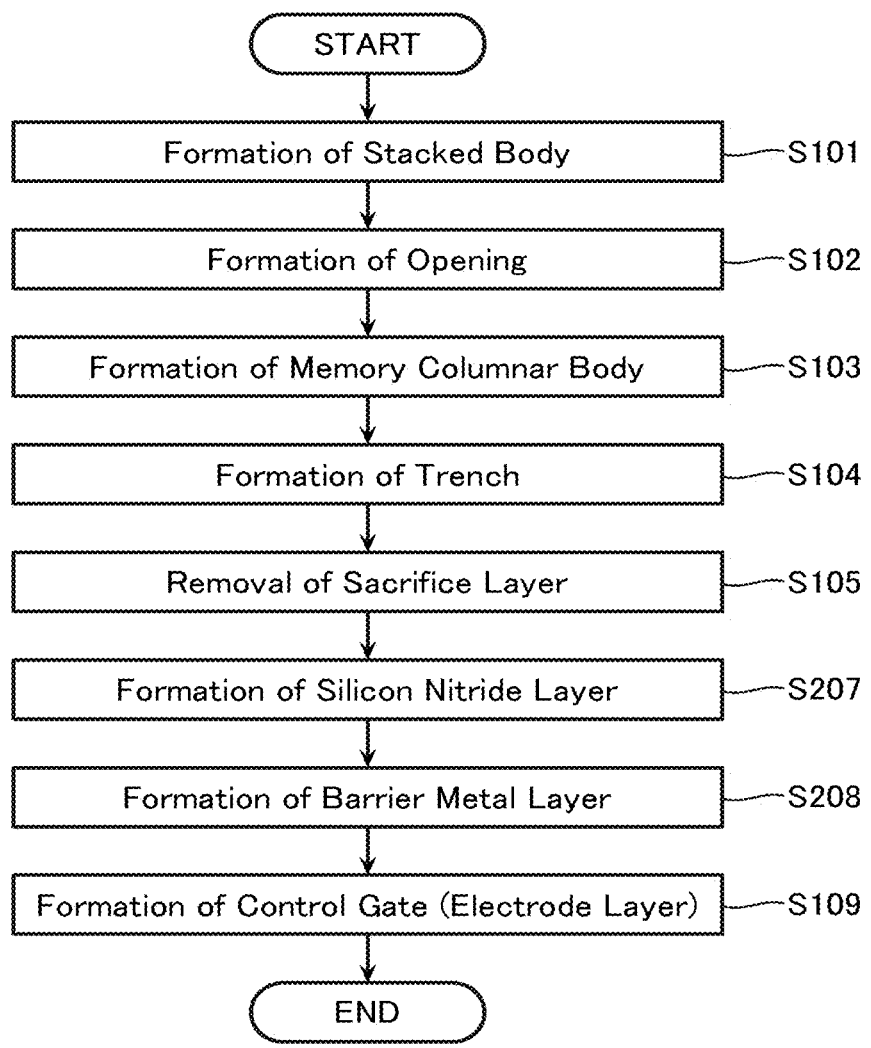
FIG. 33 is a flowchart for explaining a method of manufacturing the nonvolatile semiconductor memory device according to the second embodiment.
Figure 34:
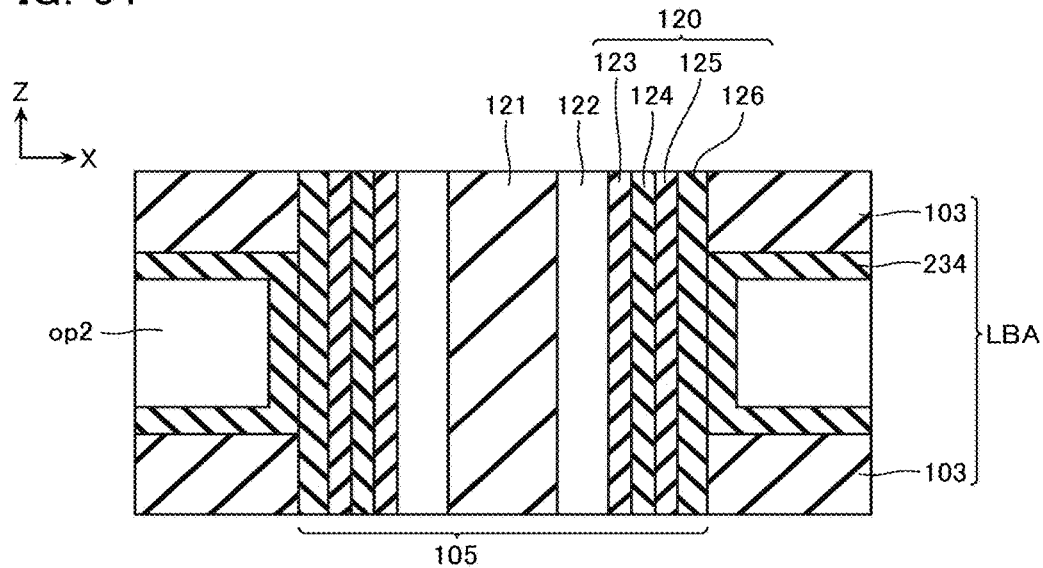
FIGS. 34 and 35 are cross-sectional views for explaining the same method of manufacturing.
Figure 35:
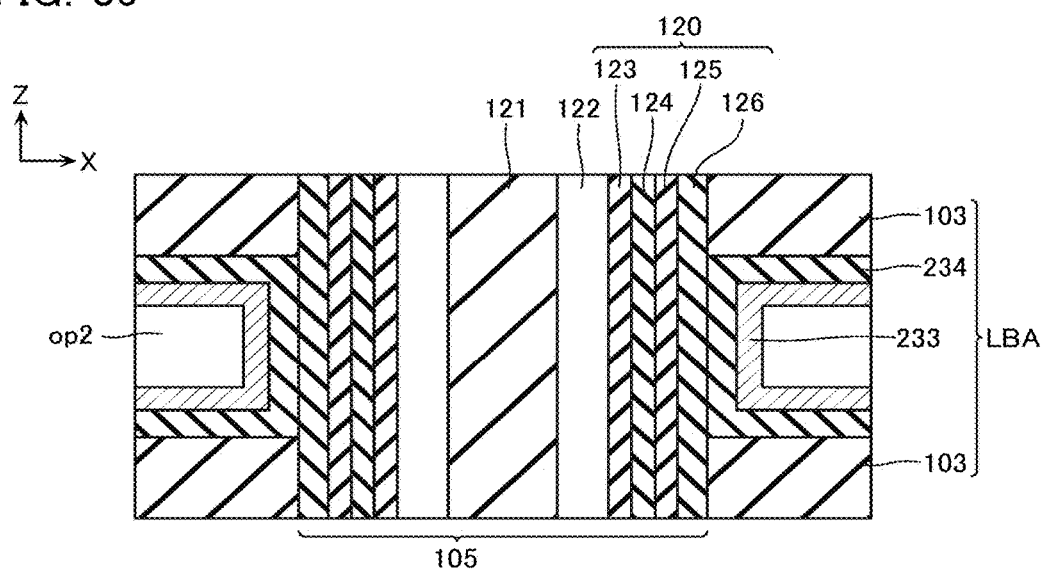

FIG. 33 is a flowchart for explaining a method of manufacturing according to the second embodiment. FIGS. 34 and 35 are cross-sectional views for explaining the same method of manufacturing, and each show a cross-section corresponding to a portion corresponding to FIG. 26.

As shown in FIG. 33, the method of manufacturing according to the present embodiment is basically performed similarly to the method of manufacturing according to the first embodiment, but is different in that step S106 is not performed, the silicon nitride layer 234 is formed in step S207, and the barrier metal layer 233 is formed in step S208.

As shown in FIGS. 33 and 34, in step S207, the silicon nitride layer 234 is formed. The silicon nitride layer 234 is formed by depositing silicon nitride ($Si_3N_4$), by a means such as CVD, on the upper surface and lower surface of the inter-layer insulating layer 103 and on the side surface of the memory columnar body 105, for example.

As shown in FIGS. 33 and 35, in step S208, the barrier metal layer 233 is formed. The barrier metal layer 233 is formed by depositing titanium nitride (TiN), or the like, by a means such as CVD, on the upper surface, lower surface, and side surface of the silicon nitride layer 234, via the opening op2, for example.

Third Embodiment

[Configuration of Semiconductor Memory Device]

Figure 36:
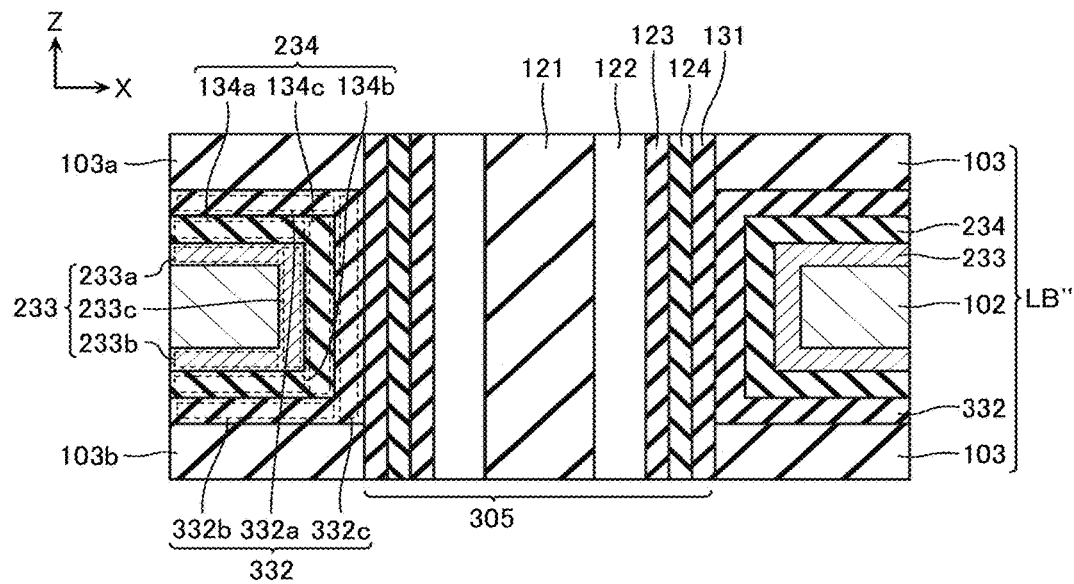
FIG. 36 is a cross-sectional view showing a configuration of part of a nonvolatile semiconductor memory device according to a third embodiment.

FIG. 36 is a schematic cross-sectional view for explaining a nonvolatile semiconductor memory device according to a third embodiment, and shows a portion corresponding to FIG. 8 (a portion corresponding to C in FIG. 6). Note that in the description below, portions similar to those of the first or second embodiments will be assigned with reference symbols identical to those assigned in the first or second embodiments, and descriptions thereof will be omitted.

The nonvolatile semiconductor memory device according to the present embodiment is basically configured similarly to the nonvolatile semiconductor memory device according to the second embodiment, but configurations of a stacked body LB' and a memory columnar body 305 are partially different. That is, in the third embodiment, the memory columnar body 305 does not include the second block insulating layer 126 (high dielectric insulating layer), and the stacked body LB'' includes a second block insulating layer 332 (high dielectric insulating layer) Note that in other respects, the memory columnar body 305 is configured similarly to the memory columnar body 105 according to the first embodiment.

The stacked body LB''-according to the present embodiment, in addition to comprising the conductive layer 102 (first metal layer), the barrier metal layer 233, and the silicon nitride layer 234, comprises also the second block insulating layer 332 (high dielectric insulating layer) which contacts the upper surface, lower surface, and side surface of the silicon nitride layer 234.

As shown in FIG. 36, the second block insulating layer 332 is configured from a high dielectric insulating layer of the likes of an aluminum oxide ($AlO_x$) such as alumina ($Al_2O_3$) or hafnium oxide ($HfO_x$), for example. In addition, the second block insulating layer 332 includes third through fifth block insulating layers 332a to 332c. The third block insulating layer 332a contacts the upper surface of the silicon nitride layer 234 and the lower surface of the first inter-layer insulating layer 103a. The fourth block insulating layer 332b contacts the lower surface of the silicon nitride layer 234 and the upper surface of the second inter-layer insulating layer 103b. The fifth block insulating layer 332c contacts the side surface of the silicon nitride layer 234 and the side surface of the memory columnar body 305 (side surface of the first block insulating layer 125).

Note that the conductive layer 102, first barrier metal layer 233a, first silicon nitride layer 134a, third block insulating layer 332a, and first inter-layer insulating layer 103a and the second barrier metal layer 233b, second silicon nitride layer 134b, fourth block insulating layer 332b, and second inter-layer insulating layer 103b overlap when viewed from above (the Z direction).

Fourth Embodiment

[Configuration of Semiconductor Memory Device]

Figure 37:
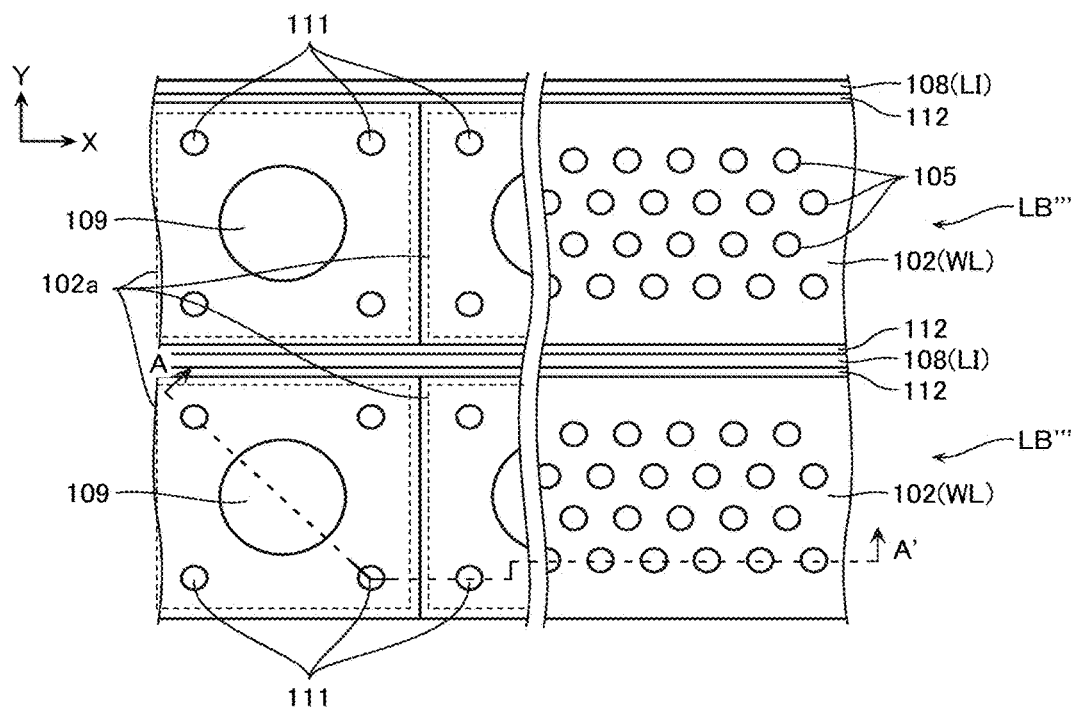
FIG. 37 is a plan view showing a configuration of part of a nonvolatile semiconductor memory device according to a fourth embodiment.
Figure 38:
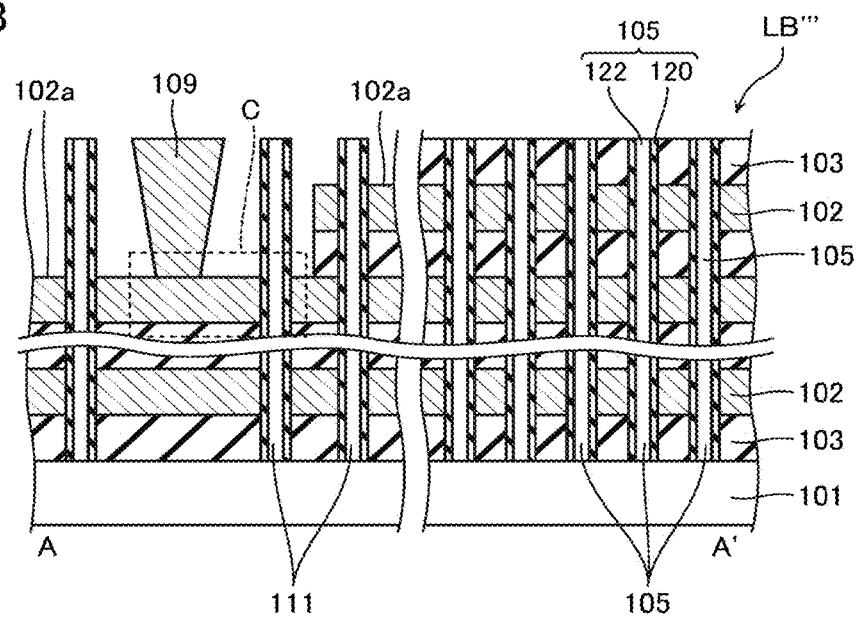
FIGS. 38 and 39 are cross-sectional views showing a configuration of part of the same nonvolatile semiconductor memory device.
Figure 39:
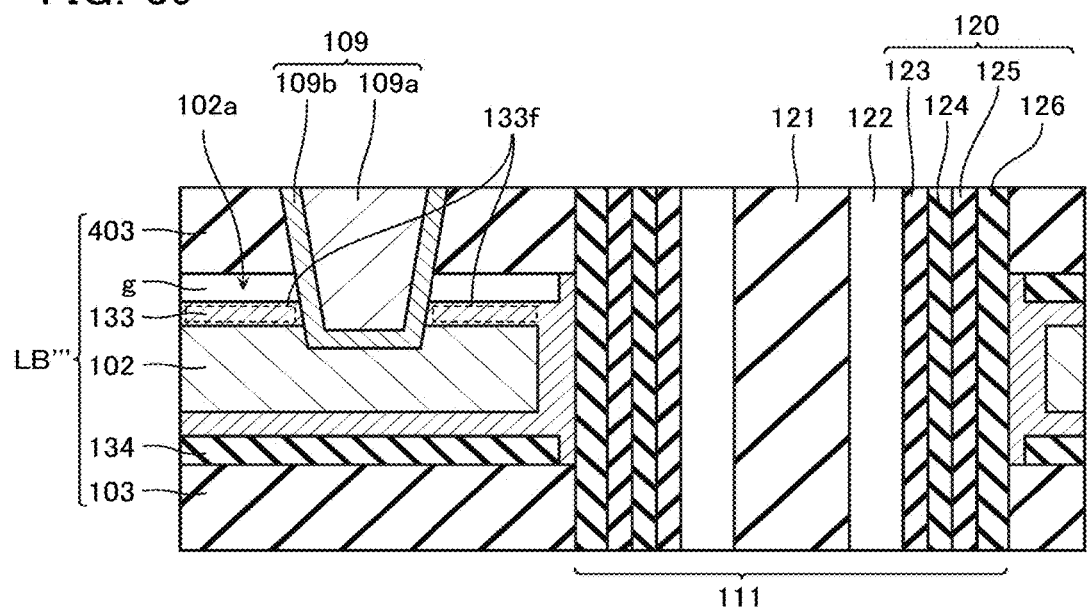

FIG. 37 is a schematic plan view for explaining a nonvolatile semiconductor memory device according to a fourth embodiment. FIG. 38 is a schematic cross-sectional view for explaining the same nonvolatile semiconductor memory device, and shows a cross-section of a portion corresponding to the line A-A' FIG. 37, FIG. 39 is a schematic cross-sectional view for explaining the same nonvolatile semiconductor memory device, and is an enlarged view of the portion indicated by C in FIG. 38. Note that in the description below, portions similar to those of the first embodiment will be assigned with reference symbols identical to those assigned in the first embodiment, and descriptions thereof will be omitted.

The nonvolatile semiconductor memory device according to the fourth embodiment is basically configured similarly to the nonvolatile semiconductor memory device according to the first embodiment, but has a different configuration close to the contact part 102a of the conductive layer 102 described with reference to FIG. 3.

As shown in FIGS. 37 and 38, the nonvolatile semiconductor memory device according to the present embodiment includes a stacked body LB''' and the memory columnar body 105. Moreover, as described with reference to FIG. 3, the conductive layers 102 in the stacked body LB''' each comprise the contact part 102a connected to the via contact wiring line 109. The dummy structure 111 is provided close to the via contact wiring line 109, of this contact part 102a.

As shown in FIG. 39, the dummy structure 111 according to the present embodiment is configured similarly to the memory columnar body 105. Moreover, the stacked body LB''' comprises: the conductive layer 102; the barrier metal layer 133; the silicon nitride layer 134; the inter-layer insulating layer 103; and an inter-layer insulating layer 403 (third inter-layer insulating layer) which is positioned upwardly of the barrier metal layer 133. The inter-layer insulating layer 403 is made of the likes of silicon oxide ($SiO_2$), for example.

Now, if it is assumed that a portion covering the contact part 102a, of the barrier metal layer 133 will be called a sixth barrier metal layer 133f, then in the present embodiment, the silicon nitride layer 134 is not provided between an upper surface of the sixth barrier metal layer 133f and a lower surface of the inter-layer insulating layer 403, and instead a gap g is provided between these surfaces.

[Advantages of Semiconductor Memory Device]

Figure 40:
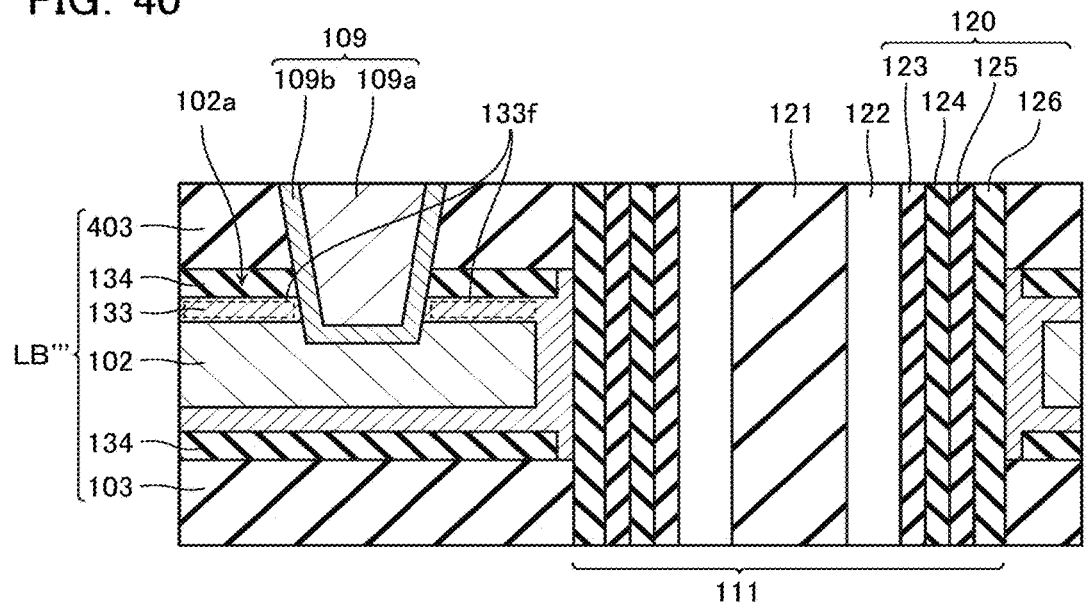
FIG. 40 is a cross-sectional view showing a configuration of part of a nonvolatile semiconductor memory device according to a second comparative example.

FIG. 40 is a cross-sectional view showing a configuration of part of a nonvolatile semiconductor memory device according to a second comparative example. Note that in the description below, portions similar to those of the fourth embodiment will be assigned with reference symbols identical to those assigned in the fourth embodiment, and descriptions thereof will be omitted.

The nonvolatile semiconductor memory device according to the second comparative example is basically configured similarly to that of the fourth embodiment, but has the silicon nitride layer 134 provided between the upper surface of the sixth barrier metal layer 133f and the lower surface of the inter-layer insulating layer 403, and in this respect is different from that of the fourth embodiment.

Now, as shown in FIG. 39, in the present embodiment, the silicon nitride layer 134 is not provided between the upper surface of the sixth barrier metal layer 133f and the lower surface of the inter-layer insulating layer 403, and instead the gap g is provided between these surfaces. Now, the gap g has a lower dielectric constant compared to silicon nitride ($Si_3N_4$). Therefore, adopting the gap g, and not silicon nitride, as a configuration between the sixth barrier metal layer 133f and the lower surface of the inter-layer insulating layer 403 makes it possible to reduce electrostatic capacitance between the conductive layers 102 adjacent in the Z direction. Note that the configuration between the sixth barrier metal layer 133f and the lower surface of the inter-layer insulating layer 403 need only be a configuration whose dielectric constant is lower than that of silicon nitride, and need not be the gap g.

[Method of Manufacturing]

Figure 41:
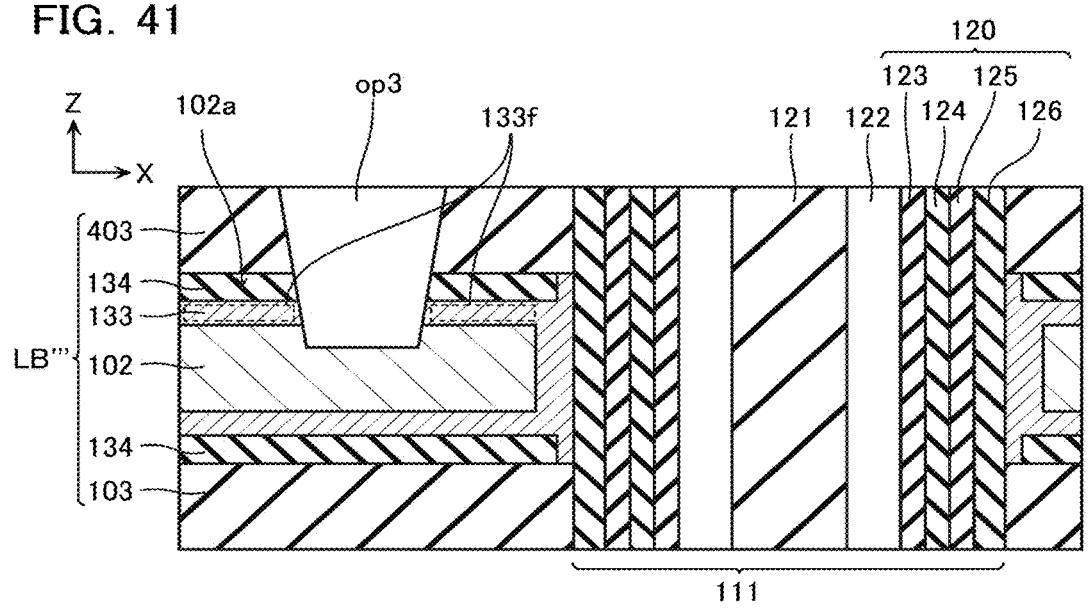
FIGS. 41 to 43 are cross-sectional views for explaining a method of manufacturing the nonvolatile semiconductor memory device according to the fourth embodiment.
Figure 42:
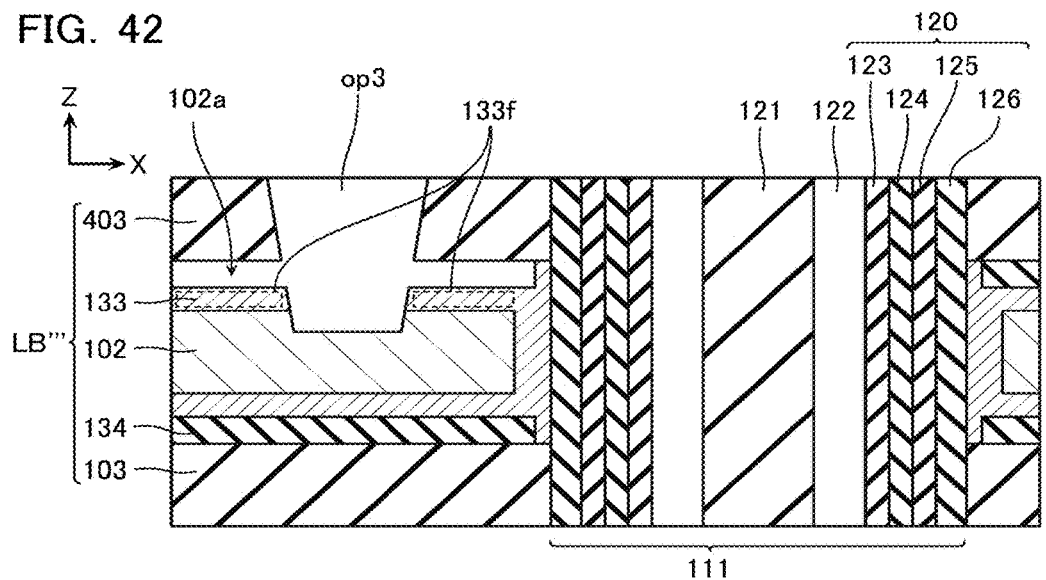
Figure 43:
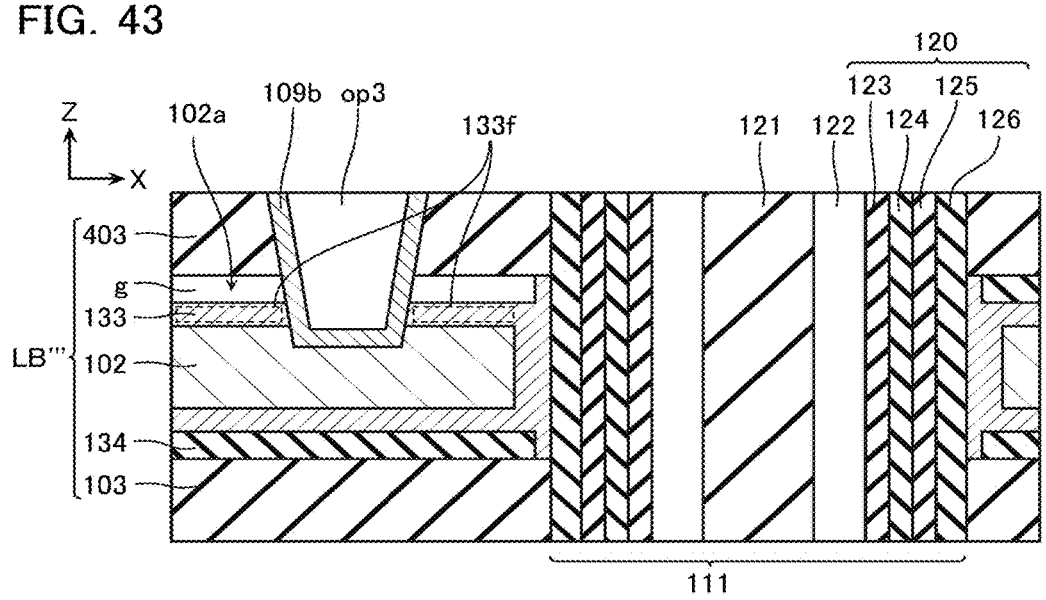

A method of manufacturing according to the present embodiment is basically similar to the method of manufacturing according to the first embodiment, but differs in the following points. For example, in the method of manufacturing according to the present embodiment, the steps described with reference to FIGS. 13 to 25 are performed. In addition, as shown in FIG. 41, an opening op3 which is to be implanted with the via contact wiring line 109 is formed, and as shown in FIG. 42, the portion positioned between the sixth barrier metal layer 133f and the lower surface of the inter-layer insulating layer 403, of the silicon nitride layer 134 is removed by the likes of wet etching employing phosphoric acid, via this opening op3. Moreover, as shown in FIG. 43, a barrier metal layer 109b is deposited on a side surface and bottom surface of the opening op3 by a means such as CVD, and as shown in FIG. 39, a metal layer 109a is formed by a means such as CVD.

Figure 44:
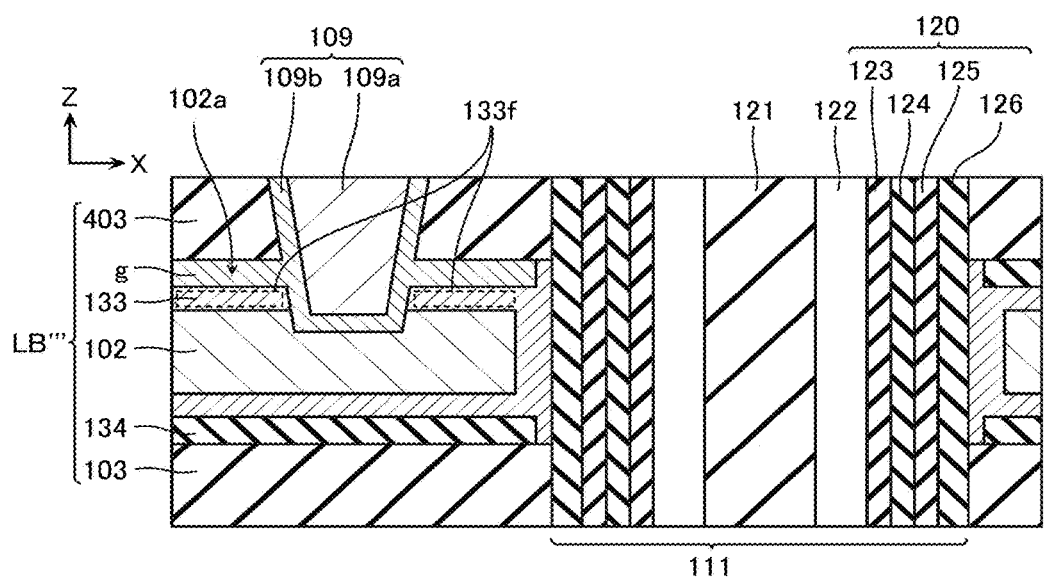
FIG. 44 is a cross-sectional view showing another configuration example of the same nonvolatile semiconductor memory device.

Note that it also sometimes occurs that when the configuration according to the present embodiment is manufactured by such a method, the metal layer 109a of the likes of tungsten (W) or the barrier metal layer 109b of the likes of titanium nitride (TiN) covering a lower surface and side surface of this metal layer 109a that configure the via contact wiring line 109, and not the gap g, is filled between the sixth barrier metal layer 133f and the lower surface of the inter-layer insulating layer 403, as shown in FIG. 44, depending on implanting performance of the via contact wiring line 109. That is, part of the via contact wiring line 109 is sometimes provided between the sixth barrier metal layer 133f and the lower surface of the inter-layer insulating layer 403.

Other Embodiments

Figure 45:
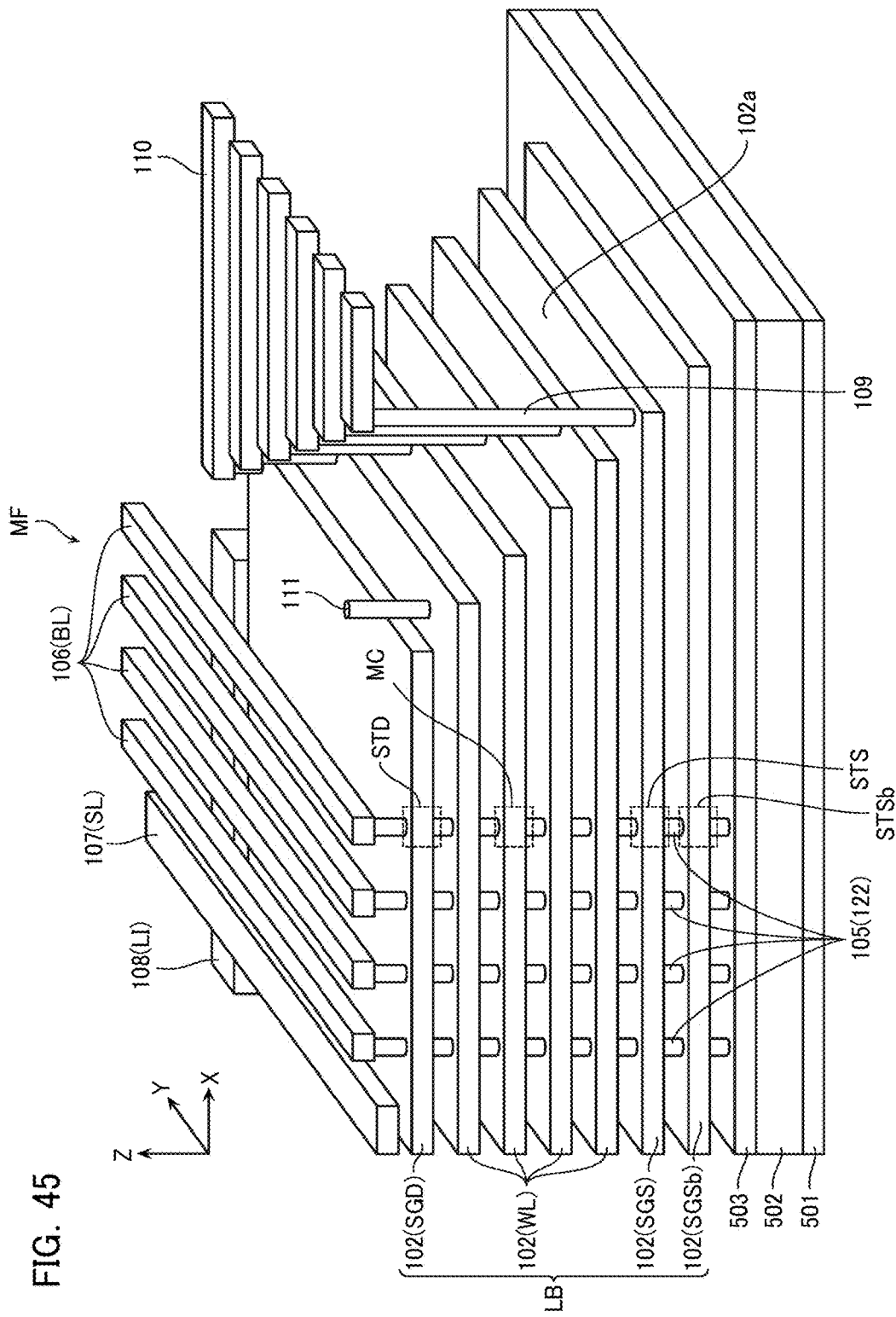
FIG. 45 is a perspective view showing a configuration of part of a nonvolatile semiconductor memory device according to another embodiment.

As shown in FIG. 3, in the first through fourth embodiments, the lower ends of the semiconductor layer 122 and the conductive layer 108 functioning as the source contact LI contact the upper surface of the substrate 101. However, the lower ends of the semiconductor layer 122 and the conductive layer 108 may be connected by the likes of a wiring line provided on the substrate. In the example shown in FIG. 45, for example, a circuit layer 502 and a conductive layer 503 are provided between a substrate 501 and the stacked body LB. The substrate 501 is a semiconductor substrate, for example. The circuit layer 502 includes the likes of a field effect transistor or a wiring line, for example. The conductive layer 503 is formed from the likes of a semiconductor such as polysilicon or a metal such as tungsten (W). Moreover, the conductive layer 503 is connected to the lower ends of the semiconductor layer 122 and the conductive layer 108 functioning as the source contact LI.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
 a stacked body including a plurality of control gate electrodes stacked upwardly of a substrate;
 a semiconductor layer extending along a first direction intersecting an upper surface of the substrate, the semiconductor layer facing the plurality of control gate electrodes in a second direction crossing the first direction; and
 a gate insulating layer provided between a control gate electrode and the semiconductor layer,
 the stacked body comprising:
  a first metal layer configuring the control gate electrode;
  a first barrier metal layer contacting an upper surface of the first metal layer;
  a first silicon nitride layer contacting an upper surface of the first barrier metal layer;
  a first inter-layer insulating layer contacting an upper surface of the first silicon nitride layer;
  a second barrier metal layer contacting a lower surface of the first metal layer;
  a second silicon nitride layer contacting a lower surface of the second barrier metal layer;
  a second inter-layer insulating layer contacting a lower surface of the second silicon nitride layer; and
  a third barrier metal layer formed integrally with the first barrier metal layer and the second barrier metal layer, wherein
  the third barrier metal layer contacts side surfaces of the first metal layer and the gate insulating layer, and a film thickness of the third barrier metal layer in the second direction is larger than a film thickness of the first barrier metal layer in the first direction and a film thickness of the second barrier metal layer in the first direction.

2. The semiconductor memory device according to claim 1, wherein
the first barrier metal layer, the second barrier metal layer, and the third barrier metal layer include at least one of titanium nitride (TiN), titanium silicon nitride (TiSiN), tantalum nitride (TaN), tantalum silicon nitride (TaSiN), and tungsten nitride (WN).

3. The semiconductor memory device according to claim 1, further comprising
a fourth barrier metal layer and a fifth barrier metal layer that are formed integrally with the third barrier metal layer,
wherein the fourth barrier metal layer projects upwardly and contacts side surfaces of the first silicon nitride layer and the gate insulating layer,
the fifth barrier metal layer projects downwardly and contacts side surfaces of the second silicon nitride layer and the gate insulating layer, and
a film thickness of the third barrier metal layer is larger than a film thickness of the fourth barrier metal layer and a film thickness of the fifth barrier metal layer.

4. The semiconductor memory device according to claim 1, further comprising:
a third silicon nitride layer formed integrally with the first silicon nitride layer and the second silicon nitride layer, wherein
the third silicon nitride layer contacts a side surface of the gate insulating layer.

5. The semiconductor memory device according to claim 4, wherein
the first barrier metal layer, the second barrier metal layer, and the third barrier metal layer include at least one of titanium (Ti), titanium nitride (TiN), titanium silicon nitride (TiSiN), tantalum (Ta), tantalum nitride (TaN), tantalum silicon nitride (TaSiN), and tungsten nitride (WN).

6. The semiconductor memory device according to claim 4, wherein
a film thickness of the third silicon nitride layer is 1.5 nm or more.

7. The semiconductor memory device according to claim 4, wherein
the semiconductor layer has a columnar or cylindrical shape.

8. The semiconductor memory device according to claim 1, wherein
the first metal layer comprises a contact part connected to a via contact wiring line,
the semiconductor memory device further comprising:
a sixth barrier metal layer contacting an upper surface of the contact part; and
a third inter-layer insulating layer positioned upwardly of the contact part,
wherein a gap or a part of the via contact wiring line is provided between an upper surface of the sixth barrier metal layer and a lower surface of the third inter-layer insulating layer.

9. The semiconductor memory device according to claim 1, wherein
the gate insulating layer
has a cylindrical shape extending along the first direction, is provided between a plurality of the control gate electrodes and the semiconductor layer,
and comprises:
a tunnel insulating layer covering a side surface of the semiconductor layer;
a charge accumulation layer covering a side surface of the tunnel insulating layer;
a first block insulating layer formed on a side surface of the charge accumulation layer and including silicon oxide ($SiO_2$); and
a second block insulating layer formed on a side surface of the first block insulating layer and configured from a high dielectric insulating layer.

10. The semiconductor memory device according to claim 9, wherein
the high dielectric insulating layer includes at least one of aluminum oxide ($AlO_x$) and hafnium oxide ($HfO_x$).

11. The semiconductor memory device according to claim 1, wherein
the first inter-layer insulating layer and the second inter-layer insulating layer include silicon oxide ($SiO_2$).

* * * * *